(12) United States Patent
Kuriyama et al.

(10) Patent No.: US 9,580,797 B2
(45) Date of Patent: Feb. 28, 2017

(54) MAGNETIC-FIELD-GENERATING APPARATUS FOR MAGNETRON SPUTTERING

(75) Inventors: Yoshihiko Kuriyama, Takasaki (JP); Masahiro Mita, Takasaki (JP)

(73) Assignee: HITACHI METALS, LTD., Tokyo (JP)

( * ) Notice: Subject to any disclaimer, the term of this patent is extended or adjusted under 35 U.S.C. 154(b) by 890 days.

(21) Appl. No.: 13/981,252

(22) PCT Filed: Jan. 12, 2012

(86) PCT No.: PCT/JP2012/050505
§ 371 (c)(1),
(2), (4) Date: Jul. 23, 2013

(87) PCT Pub. No.: WO2012/102092
PCT Pub. Date: Aug. 2, 2012

(65) Prior Publication Data
US 2013/0299349 A1    Nov. 14, 2013

(30) Foreign Application Priority Data

Jan. 24, 2011  (JP) .................................. 2011-012315
Feb. 24, 2011  (JP) .................................. 2011-038791

(51) Int. Cl.
*C23C 14/34*   (2006.01)
*C23C 14/35*   (2006.01)
*H01J 37/34*   (2006.01)

(52) U.S. Cl.
CPC ............ *C23C 14/351* (2013.01); *C23C 14/35* (2013.01); *H01J 37/3405* (2013.01);
(Continued)

(58) Field of Classification Search
CPC .... C23C 14/351; C23C 14/35; H01J 37/3405; H01J 37/3408; H01J 37/345; H01J 37/3452; H01J 37/3461
See application file for complete search history.

(56) References Cited

U.S. PATENT DOCUMENTS 4,826,584 A * 5/1989  dos Santos Pereiro Ribeiro ............... H01J 37/3408
                                                                                   204/298.09
5,512,872 A   4/1996  Ohashi
(Continued)

FOREIGN PATENT DOCUMENTS

JP    57-188679 A   11/1982
JP    60-116774 A    6/1985
(Continued)

OTHER PUBLICATIONS

Translation to Kuriyama (JP 2008-156735) published Jul. 2008.*

*Primary Examiner* — John Brayton
(74) *Attorney, Agent, or Firm* — Sughrue Mion, PLLC

(57) ABSTRACT

A racetrack-shaped magnetic-field-generating apparatus for magnetron sputtering comprising a linear portion and corner portions, the linear portion comprising a magnetic base, a center permanent magnet disposed on its surface, and side permanent magnets disposed on both sides thereof with a gap; the center and side permanent magnets being vertically magnetized with opposite polarities; the corner portions comprising a non-magnetic base, a center magnetic pole member disposed on its surface, a semicircular or semi-polygonal, peripheral magnetic pole member, and plural permanent magnets arranged between both magnetic pole members with their magnetization directions in parallel to a target surface; and the magnetic poles of plural permanent
(Continued)

magnets opposing the center magnetic pole member having the same polarity as those of the center permanent magnet opposing the target.

10 Claims, 21 Drawing Sheets

(52) U.S. Cl.
CPC ........ *H01J 37/345* (2013.01); *H01J 37/3408* (2013.01); *H01J 37/3452* (2013.01); *H01J 37/3461* (2013.01)

(56) References Cited

U.S. PATENT DOCUMENTS

| | | | |
|---|---|---|---|
| 6,361,668 B1 | | 3/2002 | Struempfel et al. |
| 6,372,098 B1 | * | 4/2002 | Newcomb ........... H01J 37/3408 204/192.12 |

FOREIGN PATENT DOCUMENTS

| | | | |
|---|---|---|---|
| JP | 1-177370 A | | 7/1989 |
| JP | 6-207271 A | | 7/1994 |
| JP | 8-134640 A | | 5/1996 |
| JP | 9-067668 A | | 3/1997 |
| JP | 11-510563 A | | 9/1999 |
| JP | 2006-016634 A | | 1/2006 |
| JP | 2008-156735 A | | 7/2008 |
| JP | 2008156735 A | * | 7/2008 |
| JP | 2009-127109 A | | 6/2009 |

* cited by examiner

MAGNETIC-FIELD-GENERATING APPARATUS FOR MAGNETRON SPUTTERING

CROSS REFERENCE TO RELATED APPLICATIONS

This application is a National Stage of International Application No. PCT/JP2012/050505 filed Jan. 12, 2012 (claiming priority based on Japanese Patent Application No. 2011-012315, filed Jan. 24, 2011, and No. 2011-038791, filed Feb. 24, 2011), the contents of which are incorporated herein by reference in their entirety.

FIELD OF THE INVENTION

The present invention relates to a magnetic-field-generating apparatus assembled in a magnetron sputtering apparatus for forming thin films on substrates.

BACKGROUND OF THE INVENTION

In the production process of electronic parts such as semiconductor ICs, etc., magnetron sputtering methods having high film-forming speeds by targets and capable of forming thin films at low temperatures because electrons are not impinged onto substrates are widely used to form thin films on substrates.

A phenomenon that atoms or molecules are ejected from a target by a high-speed bombardment of an inert substance such as Ar, etc. is called "sputtering." The ejected atoms or molecules can be accumulated on a substrate to form a thin film. A magnetron sputtering method uses a magnetic field in a cathode to increase a film-forming speed, thereby improving the productivity.

A magnetron sputtering apparatus comprises a substrate (anode), a target (cathode) arranged to oppose the substrate, and a magnetic-field-generating apparatus arranged below the target, in a vacuum chamber. With voltage applied between the anode and the cathode to cause glow discharge for ionizing an inert gas (Ar at about 0.1 Pa, etc.) in the vacuum chamber, secondary electrons discharged from the target are captured by a magnetic field generated by the magnetic-field-generating apparatus, so that cyclotron motion occurs on a target surface. Because the cyclotron motion of electrons accelerates the ionization of gas molecules, a film-forming speed is dramatically higher than when a magnetic field is not used, resulting in strong adhesion of a film.

As shown in FIG. 29, a magnetic circuit apparatus 4 used in a magnetron sputtering apparatus comprises a center rod-shaped magnet 410 magnetized in a height direction (perpendicular to a target surface), a peripheral rectangular magnet 420 arranged around the center magnet 410 and magnetized in an opposite direction to the center magnet 410, and a yoke 430 supporting the center magnet 410 and the peripheral magnet 420, to generate a leaked magnetic field in a racetrack form in parallel to a target surface (for example, see JP 8-134640 A). With a racetrack-shaped magnetic circuit, secondary electrons can be contained in a closed space, resulting in a high secondary electron density and thus high sputtering efficiency. To form this closed space, a magnetic field of 10 mT or more in a horizontal component of a magnetic flux density is usually needed.

The erosion of a target is fastest in a portion shown by a broken line in FIG. 30, in which a perpendicular component of a magnetic flux density is zero, and by adjusting a magnetic field to cause uniform erosion in this portion, a target can be used for a long period. However, when plasma is contained on a target surface by a magnetic circuit apparatus 4 as shown in FIG. 29, plasma formed in the linear portion is concentrated in the corner portions, resulting in rapid erosion in the corner portions. The concentration of plasma occurs by a magnetic flux concentrated in the corner portions, because a portion in which a perpendicular component of a magnetic flux density is zero is located at a distance R from the center magnet 410 in the linear portion, and at a smaller distance r (r<R) in the corner portions.

JP 8-134640 A discloses a technology of arranging magnets having a smaller residual magnetic flux density in a T form in corner portions, to eliminate the unevenness of a perpendicular component of a magnetic flux density in the corner portions. However, its improvement is not sufficient, making it desirable to develop a technology of alleviating the concentration of a magnetic flux in the corner portions.

JP 2008-156735 A discloses, as shown in FIGS. 31(a) and 31(b), a magnetic-field-generating apparatus 5 for magnetron sputtering, which comprises a non-magnetic base 510, a rectangular center magnetic pole piece 520 disposed on a surface of the non-magnetic base 510, a peripheral racetrack-shaped magnetic pole piece 530 disposed around the rectangular center magnetic pole piece 520, and plural permanent magnets 540, 550 arranged between the center magnetic pole piece and the peripheral magnetic pole piece, the permanent magnets 540, 550 being magnetized in a horizontal direction (in parallel to a target surface) and arranged with their magnetic poles of the same polarity opposing the center magnetic pole piece, and the center magnetic pole piece and the peripheral magnetic pole piece being higher than the permanent magnets. JP 2008-156735 A describes that because magnetic pole surfaces of the permanent magnets are in contact with the magnetic pole pieces in this magnetic-field-generating apparatus, the leakage of magnetic flux from the permanent magnets is reduced, so that a predetermined magnetic flux can be generated by a smaller number of permanent magnets than in the above magnetic circuit apparatus comprising magnets magnetized in a height direction. JP 2008-156735 A further describes that a region providing a magnetic field intensity of 10 mT or more in a horizontal component of a magnetic flux density, which is necessary for containing an inert gas excited to a plasma state, is expanded than before, thereby expanding an erosion region of a target, providing uniform erosion between the linear portion and the corner portions, thereby forming a uniform-thickness film on a substrate.

However, because the magnetic-field-generating apparatus described in JP 2008-156735 A comprises a non-magnetic base, a magnetic field leaks on the opposite side of the target in the magnetic circuit, adversely affecting control equipments for the sputtering apparatus disposed on the opposite side of the target. When large magnetic field leakage occurs on the opposite side of the target, electronic devices cannot disadvantageously be arranged on a rear side of the magnetic circuit. Though a magnetic circuit base may be formed by a magnetic material such as iron to prevent magnetic field leakage, only a small amount of a magnetic field appears on the target side because most magnetic fields generated pass through the magnetic base. Further, because most part of the linear portion is occupied by magnets in the magnetic-field-generating apparatus described in JP 2008-156735 A, fastening members such as screws are not easily arranged there, making it difficult to fix it to a sputtering apparatus.

Thus desired is the development of an efficient magnetic-field-generating apparatus for magnetron sputtering, which has the reduced influence of a leaked magnetic field on a sputtering apparatus, is easily fixed to a sputtering apparatus, and provides the uniform erosion of a target.

As a technology of expanding an erosion region to provide a proper perpendicular component distribution of a magnetic field on a target surface in the use of a magnetic circuit apparatus 4 as shown in FIG. 29, JP 2006-16634 A discloses a magnetic-field-generating apparatus comprising magnetic plates (shunt plates) arranged in parallel to a target surface between the magnetic pole of the center magnet and the magnetic pole of the peripheral magnet. JP 2006-16634 A describes that the shunt plates contribute to the formation of a region in which a perpendicular component of a magnetic field generated by the magnetic circuit on a target surface is zero or flat near zero, or a region crossing the zero point three times.

However, because the magnetic-field-generating apparatus described in JP 2006-16634 A has a structure in which shunt plates are arranged between the magnetic circuit and the target, the removal and position adjustment of the shunt plates for adjusting a magnetic field cannot easily be conducted. Also, because vacuum should be released when a target-containing chamber is in a vacuum state, for example, a demand for adjusting a magnetic field depending on the erosion of a target during sputtering cannot be met.

In electronic parts constituted by multilayer thin films such as semiconductor ICs, etc., various metal films and alloy films are necessary, needing different targets for various layers. In a sputtering apparatus for producing such electronic parts, sputtering should be conducted with different targets for various layers under conditions suitable for them. Because magnetic field intensity is one of factors having large influence on production efficiency and the properties of metal films among sputtering conditions, there is a demand for properly adjusting magnetic field intensity for each of layers formed with different targets. Though the adjustment of magnetic field intensity is possible to some extent by changing the distance between the magnetic-field-generating apparatus and the target, it is extremely difficult to change a magnetic field finely depending on the position of the target. Thus, the development of a magnetic-field-adjusting means for an optimum magnetic circuit is desired.

OBJECTS OF THE INVENTION

Accordingly, the first object of the present invention is to provide a magnetic-field-generating apparatus for magnetron sputtering, which has an expanded region of a high magnetic flux density in a horizontal component to provide a target with uniform erosion, thereby forming a uniform-thickness thin film on a substrate, with reduced magnetic field leakage and thus little influence on a sputtering apparatus.

The second object of the present invention is to provide a magnetic-field-generating apparatus for magnetron sputtering, whose magnetic field can be adjusted easily during sputtering without removing a target, so that pluralities of targets can be used.

SUMMARY OF THE INVENTION

As a result of intensive research in view of the above objects, the inventors have found that in a magnetic-field-generating apparatus comprising a center rod-shaped magnet magnetized in a height direction, and a peripheral rectangular magnet arranged around the center magnet and magnetized in an opposite direction, changing the structure of each corner portion to have a center magnetic pole member, a peripheral magnetic pole member, and permanent magnets magnetized in parallel to a target surface provides a magnetic-field-generating apparatus operable with little magnetic field leakage, which can be mounted to a sputtering apparatus easily, a portion in which a perpendicular component of a magnetic flux density is zero in each corner portion being shifted outward, resulting in uniform erosion between the linear portion and the corner portions. The present invention has been completed based on such findings.

The inventors have further found that in a magnetic-field-generating apparatus for magnetron sputtering comprising on a non-magnetic base, a center magnetic pole member, a peripheral magnetic pole member, and plural permanent magnets arranged with their magnetization directions in parallel to a target surface between them, the arrangement of magnetic shunts for adjusting a magnetic field in the non-magnetic base enables the adjustment of a magnetic field by simple operation without releasing vacuum. The present invention has been completed based on such findings.

Thus, the first magnetic-field-generating apparatus of the present invention for generating a magnetic field on a target surface for magnetron sputtering has a racetrack shape comprising a linear portion and corner portions, the linear portion comprising a magnetic base, a center rectangular permanent magnet disposed on a surface of the magnetic base, and two side rectangular permanent magnets disposed on a surface of the magnetic base in parallel to and on both sides of the center permanent magnet with a gap;

the center permanent magnet and the side permanent magnets arranged with their magnetization directions perpendicular to the target surface and their polarities opposite;

each of the corner portions comprising a non-magnetic base, a center magnetic pole member disposed on a surface of the non-magnetic base, a peripheral magnetic pole member disposed in a semicircular or semi-polygonal form with the center magnetic pole member as a center, and plural permanent magnets arranged between the center magnetic pole member and the peripheral magnetic pole member;

the plural permanent magnets being arranged with their magnetization directions in parallel to a surface of the target and the same polarity opposing the center magnetic pole member; and the magnetic poles of the plural permanent magnets opposing the center magnetic pole member having the same polarity as that of the magnetic pole of the center permanent magnet facing the target.

The permanent magnets constituting the corner portions are preferably fan-shaped or trapezoidal permanent magnets when viewed from above.

The permanent magnets constituting the corner portions preferably occupy 30% or more of an area between the center magnetic pole member and the peripheral magnetic pole member when viewed from above.

A space between the center magnetic pole member and the peripheral magnetic pole member is preferably filled with the permanent magnets, and non-magnetic spacers occupying other portions than the permanent magnets.

The linear portion is preferably filled with a non-magnetic spacer between the center permanent magnet and the side permanent magnets.

Positions at which a perpendicular component of a magnetic flux density of a magnetic field on the target surface is zero preferably meet the requirement of $R \leq r$, wherein r is a horizontal distance from the center magnetic pole member in the corner portions, and R is a horizontal distance from the center permanent magnet in the linear portion.

A horizontal component of a magnetic flux density at positions, at which a perpendicular component of the magnetic flux density on the target surface is zero, is preferably 10 mT or more in the corner portions.

The center permanent magnet and the side permanent magnets constituting the linear portion are preferably rare earth magnets, and the plural permanent magnets constituting the corner portions are preferably ferrite magnets.

The linear portion is preferably wider than each of the corner portions in a boundary in which the linear portion is opposing each of the corner portions.

Magnetic shunts for adjusting a magnetic field are preferably arranged in the corner portions on the side of the base with respect to the permanent magnets.

The second racetrack-shaped magnetic-field-generating apparatus of the present invention for generating a magnetic field on a target surface for magnetron sputtering comprises a non-magnetic base, a rod-shaped, center magnetic pole member disposed on a surface of the non-magnetic base, a peripheral magnetic pole member disposed around the center magnetic pole member, and plural permanent magnets arranged between the center magnetic pole member and the peripheral magnetic pole member, the plural permanent magnets being arranged with their magnetization directions in parallel to a surface of the target and their magnetic poles of the same polarity opposing the center magnetic pole member; and magnetic shunts for adjusting a magnetic field generated being arranged on the side of the base with respect to the plural permanent magnets.

The peripheral magnetic pole member is preferably polygonal in each corner portion.

The magnetic shunts are preferably arranged in or on the non-magnetic base.

The magnetic shunts are preferably constituted by pluralities of detachable portions.

The third circular magnetic-field-generating apparatus of the present invention for generating a magnetic field on a target surface for magnetron sputtering comprises a non-magnetic base, a circular center magnetic pole member disposed on a surface of the non-magnetic base, an annular peripheral magnetic pole member disposed around the center magnetic pole member, and plural permanent magnets arranged between the center magnetic pole member and the peripheral magnetic pole member, the plural permanent magnets being arranged with their magnetization directions in parallel to a surface of the target and their magnetic poles of the same polarity opposing the center magnetic pole member; and magnetic shunts for adjusting a magnetic field generated being arranged on the side of the base with respect to the plural permanent magnets.

DESCRIPTION OF THE PREFERRED EMBODIMENTS

Figure 1A:
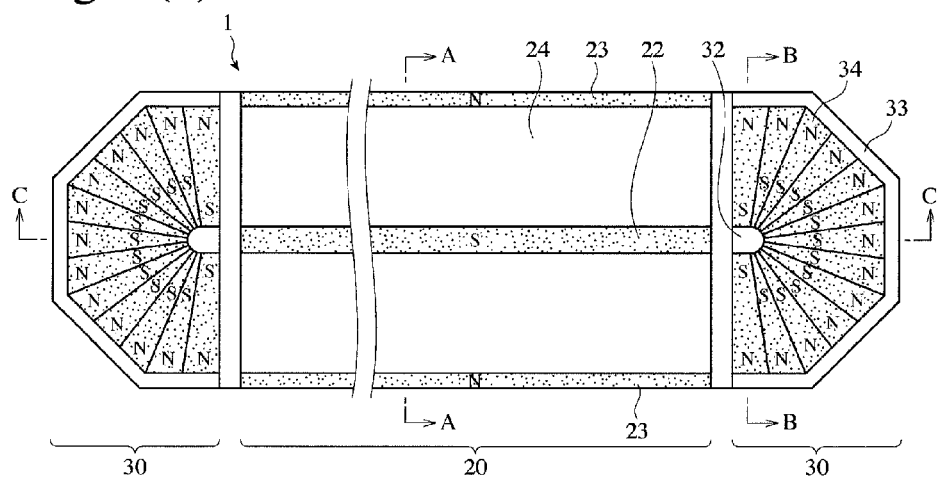
FIG. 1(a) is a plan view showing an example of the first magnetic-field-generating apparatuses for magnetron sputtering according to the present invention.
Figure 1B:
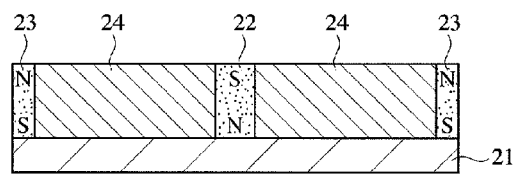
FIG. 1(b) is a cross-sectional view taken along the line A-A in FIG. 1(a).
Figure 1C:
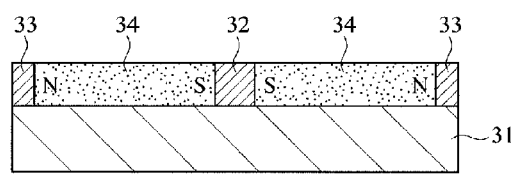
FIG. 1(c) is a cross-sectional view taken along the line B-B in FIG. 1(a).
Figure 1D:
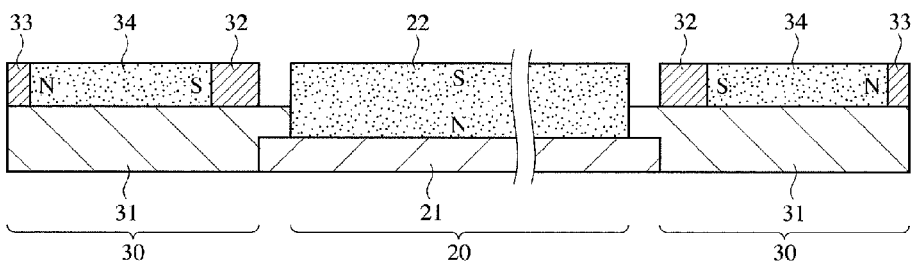
FIG. 1(d) is a cross-sectional view taken along the line C-C in FIG. 1(a).

[1] First Magnetic-Field-Generating Apparatus for Magnetron Sputtering

The first magnetic-field-generating apparatus 1 for magnetron sputtering according to the present invention is an apparatus for generating a racetrack-shaped magnetic field on a target surface, which has a racetrack shape comprising a linear portion 20 and two corner portions 30, 30 as shown in FIG. 1.

The linear portion 20 comprising a magnetic base 21, a center rectangular permanent magnet 22 arranged on a surface of the magnetic base 21, and two side rectangular permanent magnets 23, 23 arranged with distance from the center permanent magnet 22 on both sides thereof in parallel thereto on a surface of the magnetic base 21, the center permanent magnet 22 and the side permanent magnets 23 having magnetization directions perpendicular to a target surface, and the center permanent magnet 22 and the side permanent magnets 23 being arranged with their polarities opposite.

Though each of the center permanent magnet 22 and the side permanent magnets 23 constituting the linear portion may have an integral rectangular shape when viewed from above, it may be composed of pluralities of rectangular permanent magnets connected in line when viewed from above. A gap between the center permanent magnet 22 and the side permanent magnet 23 may or may not be filled with a non-magnetic spacer 24.

Each of the corner portions 30 comprises a non-magnetic base 31, a center magnetic pole member 32 disposed on a surface of the non-magnetic base 31, a peripheral magnetic pole member 33 disposed in a semicircular or semi-polygonal shape with the center magnetic pole member 32 as a center, and plural permanent magnets 34 arranged between the center magnetic pole member 32 and the peripheral magnetic pole member 33; the plural permanent magnets 34 being arranged such that (a) their magnetization directions are in parallel to the surface of the target, that (b) their magnetic poles of the same polarity are opposing the center magnetic pole member 32, and that (c) the magnetic poles of the plural permanent magnets 34 opposing the center magnetic pole member 32 have the same polarity as that of the magnetic pole of the center permanent magnet 22 opposing the target in the linear portion 20.

In a conventional magnetic-field-generating apparatus 4 (see FIG. 29), a portion in which a perpendicular component of a magnetic flux density is zero (shown by a broken line in FIG. 30) is located with a distance R from a center magnet 410 in a linear portion, and with a smaller distance r (r<R) in corner portions. Accordingly, the magnetic flux is concentrated in a portion with its perpendicular component zero in each corner portion, so that erosion proceeds faster particularly in this magnetic-flux-concentrated portion in each corner portion.

Figure 2:
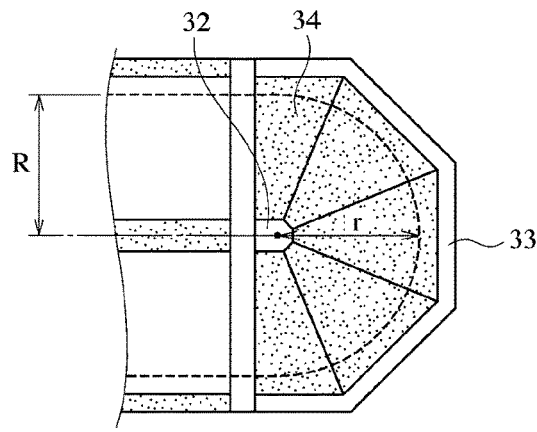
FIG. 2 is a schematic view showing a portion in which a perpendicular component of a magnetic flux density on a target surface is zero, in a magnetic field generated by the first magnetic-field-generating apparatus for magnetron sputtering according to the present invention.

In the magnetic-field-generating apparatus 1 of the present invention, however, its linear portion and corner portions have substantially uniform magnetic resistance, so that a portion in which perpendicular component of a magnetic flux density of the magnetic field is zero on a target surface is expanded outward in the corner portions, as shown in FIG. 2. The portion in which a perpendicular component of a magnetic flux density of the magnetic field is zero on a target surface is preferably located at positions meeting R≤r, wherein r represents a horizontal distance from the center magnetic pole member in the corner portions, and R represents a horizontal distance from the center permanent magnet in the linear portion. With such a magnetic field, erosion proceeds more uniformly in the corner portions, resulting in higher efficiency of using the target. A horizontal component of the magnetic flux density at positions at which a perpendicular component of a magnetic flux density of the magnetic field is zero on a target surface is preferably 10 mT or more in the corner portions.

R is a horizontal distance between a longitudinal centerline of the center permanent magnet and a line along which the perpendicular component of a magnetic flux density is zero, and r is a horizontal distance in a longitudinal direction from a center point of the center magnetic pole member, whose end portion is assumed to have a semicircular shape, to the line along which the perpendicular component of a magnetic flux density is zero. The longitudinal direction means the direction of the longitudinal centerline of the center permanent magnet in the linear portion.

Figure 3:
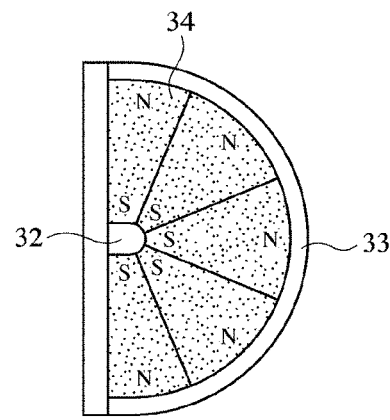
FIG. 3 is a plan view showing another example of corner portions in the first magnetic-field-generating apparatus for magnetron sputtering according to the present invention.
Figure 31A:
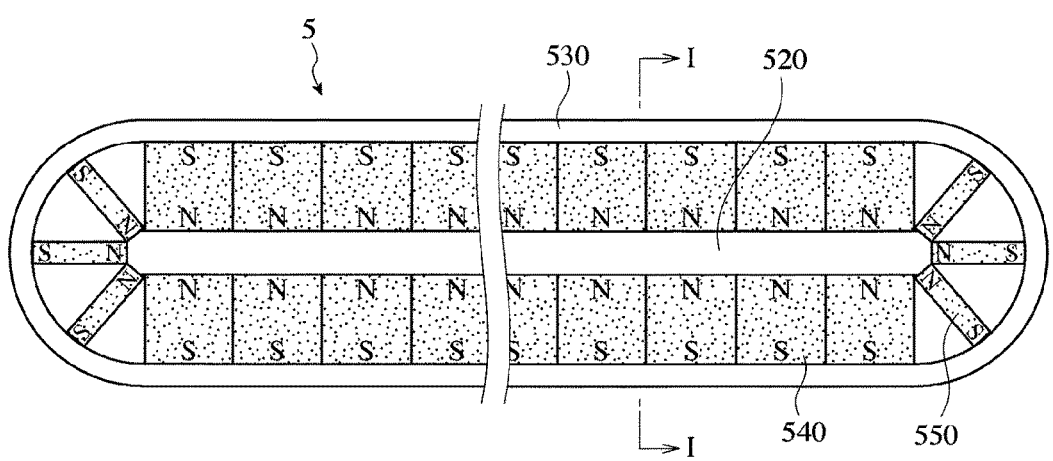
FIG. 31(a) is a plan view showing another example of conventional magnetic-field-generating apparatuses for magnetron sputtering.
Figure 31B:
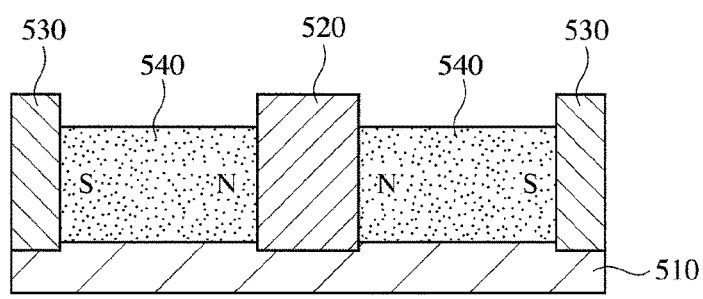
FIG. 31(b) is a cross-sectional view taken along the line I-I in FIG. 31(a).

When viewed from above, plural permanent magnets 34 constituting each corner portion 30 are preferably substantially trapezoidal when the peripheral magnetic pole member 33 is semi-polygonal as shown in FIG. 1, and substantially fan-shaped when the peripheral magnetic pole member 33 is semicircular as shown in FIG. 3. As in the corner portions of the magnetic-field-generating apparatus shown in FIG. 31(a), they may be rectangular when viewed from above. The number and size of plural permanent magnets 34 are not particularly restricted, but they have any sizes from the aspect of easiness of production and assembly, and their sizes may be different.

Figure 4:
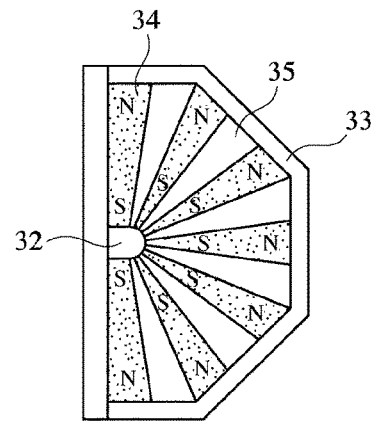
FIG. 4 is a plan view showing a further example of corner portions in the first magnetic-field-generating apparatus for magnetron sputtering according to the present invention.
Figure 5:
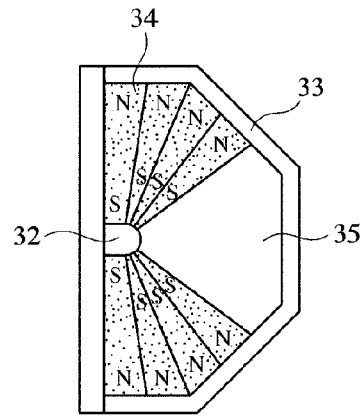
FIG. 5 is a plan view showing a still further example of corner portions in the first magnetic-field-generating apparatus for magnetron sputtering according to the present invention.

The permanent magnets 34 constituting each corner portion 30 may fill space between the center magnetic pole member 32 and the peripheral magnetic pole member 33 without gap, or with gaps 35 as shown in FIGS. 4 and 5, when viewed from above. The arrangement of the permanent magnets 34 with such gaps 35 enables the adjustment of the magnetic flux density. The gaps 35 may be filled with non-magnetic spacers. The occupation ratio of the permanent magnets 34 to the total area of space between the center magnetic pole member 32 and the peripheral magnetic pole member 33 is preferably 30% or more, more preferably 30-80%.

Figure 6A:
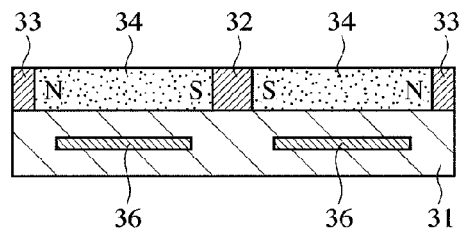
FIG. 6(a) is a schematic cross-sectional view showing an example of magnetic shunts disposed in a corner portion in the first magnetic-field-generating apparatus for magnetron sputtering according to the present invention.

In the corner portions 30, magnetic shunts 36 for adjusting the magnetic field are preferably arranged on the side of the base 31 with respect to the permanent magnets 34, as shown in FIG. 6(a). With the magnetic shunts 36 arranged, it is possible to increase the amount of magnetic flux lines flowing toward the base 31, while relatively decreasing the amount of magnetic flux lines flowing toward the target, resulting in a uniform magnetic field in the overall magnetic-field-generating apparatus, which leads to the uniform erosion of the target.

The magnetic shunts 36 are arranged preferably on the opposite side of the target with respect to the permanent magnets 34. Even when the magnetic shunts 36 are disposed on the same side as the target, the amount of magnetic flux lines can be adjusted, but the arrangement of the magnetic shunts 36 on the side of the target should be conducted after the magnetic-field-generating apparatus 1 is disassembled with vacuum released. Accordingly, the magnetic shunts 36 are once disposed, they cannot easily be removed, making it impossible to adjust the amount of magnetic flux lines during a sputtering process. On the other hand, the arrangement of the magnetic shunts 36 on the side of the base 31 permits the magnetic shunts 36 to be removed by a simple operation, thereby making it possible to change the size, thickness, density, etc. of the magnetic shunts 36 depending on the type of a target used for sputtering, sputtering conditions, etc., to adjust the magnetic field. In addition, the arrangement of the magnetic shunts 36 on the side of the base 31 is effective for reducing the amount of magnetic flux leaking from a rear surface of the base 31.

Figure 6B:
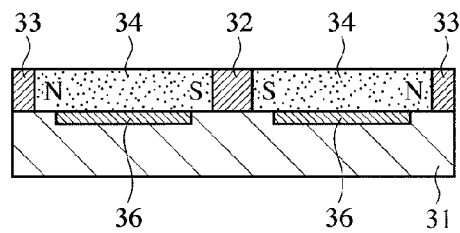
FIG. 6(b) is a schematic cross-sectional view showing another example of magnetic shunts disposed in corner portions in the first magnetic-field-generating apparatus for magnetron sputtering according to the present invention.
Figure 6C:
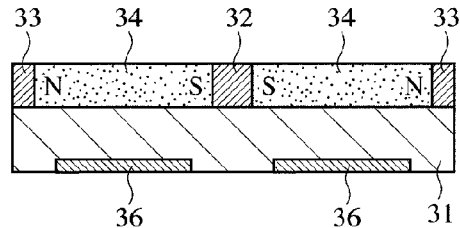
FIG. 6(c) is a schematic cross-sectional view showing a further example of magnetic shunts disposed in corner portions in the first magnetic-field-generating apparatus for magnetron sputtering according to the present invention.
Figure 6D:
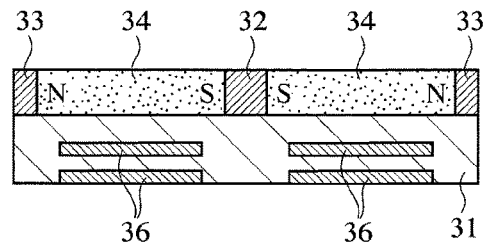
FIG. 6(d) is a schematic cross-sectional view showing a still further example of magnetic shunts in disposed in corner portions in the first magnetic-field-generating apparatus for magnetron sputtering according to the present invention.
Figure 6E:
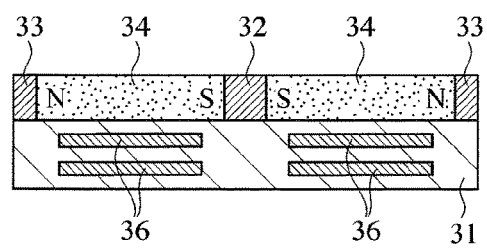
FIG. 6(e) is a schematic cross-sectional view showing a still further example of magnetic shunts disposed in corner portions in the first magnetic-field-generating apparatus for magnetron sputtering according to the present invention.
Figure 6F:
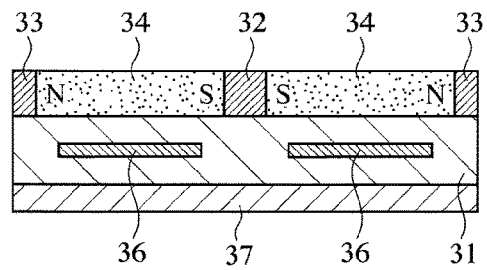
FIG. 6(f) is a schematic cross-sectional view showing a still further example of magnetic shunts disposed in corner portions in the first magnetic-field-generating apparatus for magnetron sputtering according to the present invention.

The magnetic shunts 36 are disposed preferably in the base 31 [FIG. 6(a)], on an upper surface of the base 31 [FIG. 6(b)], or on a lower surface of the base 31 [FIG. 6(c)], and two or more magnetic shunts 36 may be disposed [FIG. 6(d) or 6(e)]. These variations may properly be selected depending on the types of a sputtering object, a target, etc. A magnetic shield plate 37 may be further disposed below the base 2 containing the magnetic shunts 36 [FIG. 6(f)].

Figure 7:
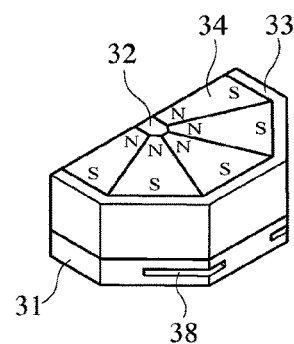
FIG. 7 is a perspective view showing an example of corner portions having holes in which magnetic shunts are inserted, in the first magnetic-field-generating apparatus for magnetron sputtering according to the present invention.
Figure 8A:
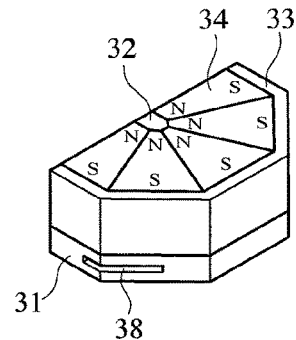
FIG. 8(a) is a perspective view showing another example of corner portions having a hole into which a shunt member is inserted, in the first magnetic-field-generating apparatus for magnetron sputtering according to the present invention.
Figure 8B:
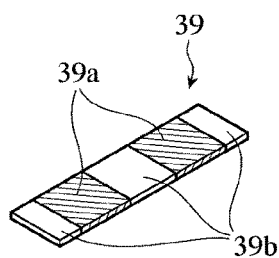
FIG. 8(b) is a perspective view showing a shunt member used in the corner portion of the magnetic-field-generating apparatus of FIG. 8(a).

The magnetic shunts 36 are easily detachable, because they can be inserted into the base 31 through holes 38 opening on transverse side surfaces of the base 31 as shown in FIG. 7. Also, as shown in FIG. 8(a), a shunt member 39 comprising magnetic portions 39a and non-magnetic portions 39b as shown in FIG. 8(b) may be inserted into the base 31 through a hole 38 opening on a transverse side surface of the base 31.

Figure 9:
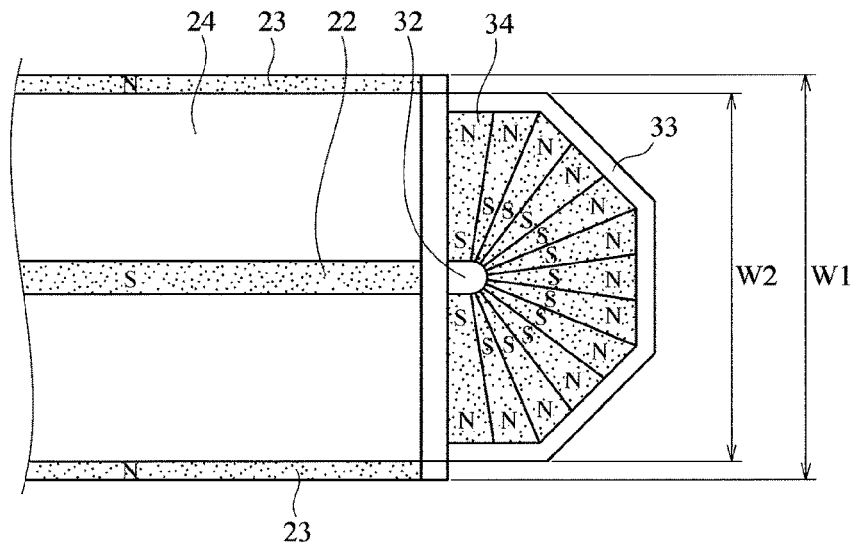
FIG. 9 is a partial plan view showing another example of the first magnetic-field-generating apparatuses for magnetron sputtering according to the present invention.
Figure 26:
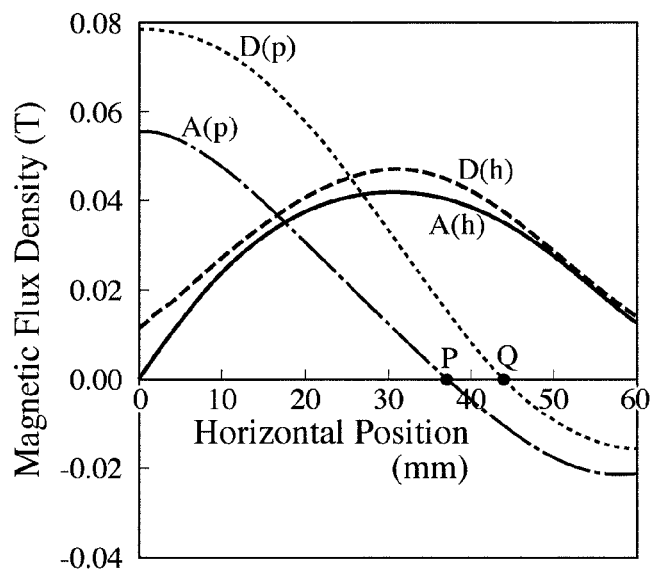
FIG. 26 is a graph showing magnetic flux density distributions provided by the magnetic-field-generating apparatus of Example 1.

As shown in FIG. 9, in a boundary in which the linear portion 20 opposes the corner portion 30, the width W1 of the linear portion 20 is preferably larger than the width W2 of each corner portion 30. With such structure, erosion lines (corresponding to portions in which the perpendicular component of a magnetic flux density is zero), which are formed by the magnetic-field-generating apparatus, are smoothly connected between the linear portion and each corner portion. For example, in a graph of FIG. 26 showing a magnetic flux density distribution generated by the magnetic-field-generating apparatus of Example 1, a point P becomes closer to a point Q, resulting in erosion lines smoothly connected between the linear portion and each corner portion. The width W1 of the linear portion 20 and the width W2 of the corner portions 30 preferably meet the relation of $W1 \geq W2 \geq W1 \times 0.8$.

The width W1 of the linear portion 20 is preferably 150 mm or less. With the width W1 of 150 mm or less, a film having a more uniform thickness can be formed on a substrate. The width W1 is preferably 100 mm or less in practical applications. The linear portion 20 and the corner portions 30 are arranged preferably with a predetermined gap. The gap makes smaller the influence of a magnetic field generated by magnets in the linear portion on the corner portions. A non-magnetic spacer may or may not be arranged between the linear portion 20 and the corner portions 30.

The permanent magnets may be formed by known permanent magnet materials. To obtain a particularly high magnetic flux density, the center permanent magnet and the side permanent magnets constituting the linear portion are formed preferably by rare earth magnets, more preferably by anisotropic sintered R-T-B magnets comprising R (at least one of rare earth elements such as Nd, etc.), T (Fe or Fe and Co) and B as indispensable components, which are subject to various surface treatments for corrosion resistance. Though the rare earth magnets may be used for plural permanent magnets constituting the corner portions, it is preferable to use smaller permanent magnets than those for the linear portion, or ferrite magnets having smaller magnetic flux densities than those of rare earth magnets, because smaller magnetic flux densities than those of permanent magnets for the linear portion are sufficient to achieve the uniform erosion of a target.

The size of ferrite magnets may be properly determined depending on their magnetic properties. For example, in the structure shown in FIG. 1, ferrite magnets and magnetic pole pieces about 2-3 times as thick as rare earth magnets in a height direction from the non-magnetic base (in a direction perpendicular to magnetization in ferrite magnets) can be used to obtain a magnetic flux density on the same level. With such structure, an erosion region of a target can be expanded, resulting in a longer target life, and a film with uniform thickness formed on a substrate.

The magnetic base, the magnetic pole members and the shunt plates may be formed by known magnetic materials (soft-magnetic materials), suitably magnetic steel.

By arranging plural magnetic-field-generating apparatuses of the present invention in parallel with predetermined intervals, and swinging them at the same amplitude as the intervals, a film can be formed on a large substrate with an integral target. The magnetic-field-generating apparatus may be provided with a mechanism for adjusting the distance between an upper surface of the magnetic-field-generating apparatus and a target surface.

Figure 10A:
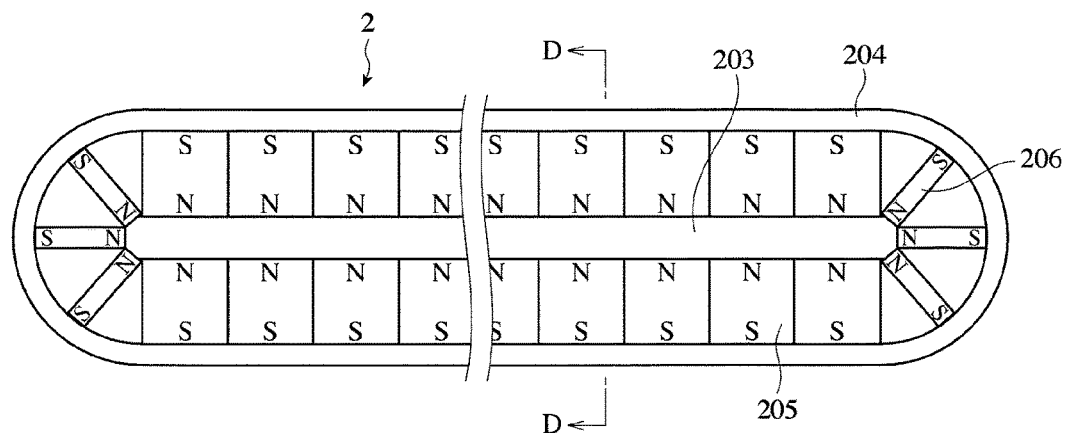
FIG. 10(a) is a plan view showing an example of the second magnetic-field-generating apparatuses for magnetron sputtering according to the present invention.
Figure 10B:
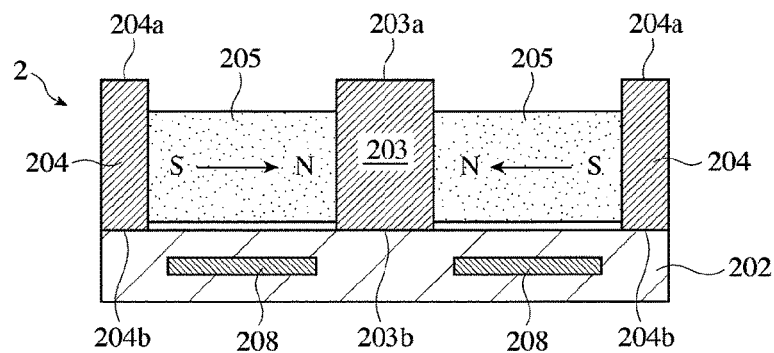
FIG. 10(b) is a cross-sectional view taken along the line D-D in FIG. 10(a).

[2] Second Magnetic-Field-Generating Apparatus for Magnetron Sputtering (1) Structure The second magnetic-field-generating apparatus 2 for magnetron sputtering according to the present invention comprises, as shown in FIGS. 10(a) and 10(b), a non-magnetic base 202; a center rod-shaped magnetic pole member 203 disposed at a center of the non-magnetic base 202; a peripheral magnetic pole member 204 disposed around the center magnetic pole member 203; permanent magnets 205 for the linear portion and permanent magnets 206 for the corner portions arranged with their magnetization directions in parallel to a target surface, in a racetrack-shaped region between the center magnetic pole member 203 and the peripheral magnetic pole member 204; and magnetic shunts 208 disposed on the side of the base 202 with respect to the permanent magnets 205 for the linear portion and the permanent magnets 206 for the corner portions; the permanent magnets being opposing a rear surface of the target 207 (see FIG. 12) with a predetermined gap. The plural permanent magnets 205 for the linear portion and the plural permanent magnets 206 for the corner portions are arranged with their magnetic poles of the same polarity, for example, N pole, facing the center magnetic pole member 203.

Figure 11A:
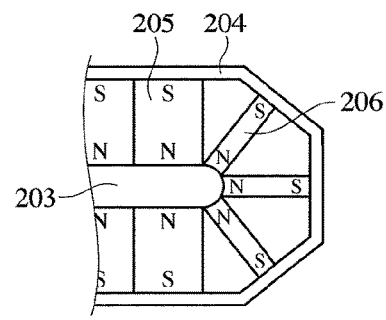
FIG. 11(a) is a plan view showing an example of the shapes of an end portion of a center magnetic pole member and a peripheral magnetic pole member in each corner portion, in the second magnetic-field-generating apparatus for magnetron sputtering according to the present invention.
Figure 11B:
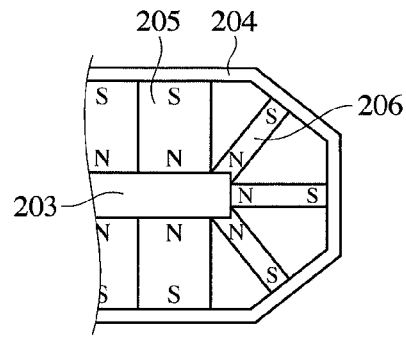
FIG. 11(b) is a plan view showing another example of the shapes of an end portion of a center magnetic pole member and a peripheral magnetic pole member in each corner portion, in the second magnetic-field-generating apparatus for magnetron sputtering according to the present invention.
Figure 11C:
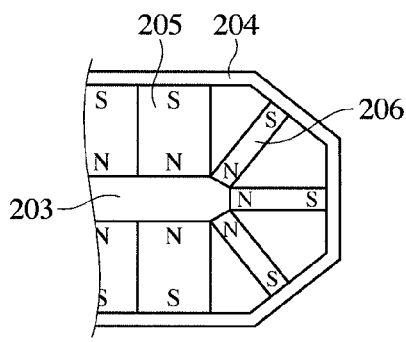
FIG. 11(c) is a plan view showing a further example of the shapes of an end portion of a center magnetic pole member and a peripheral magnetic pole member in each corner portion, in the second magnetic-field-generating apparatus for magnetron sputtering according to the present invention.
Figure 11D:
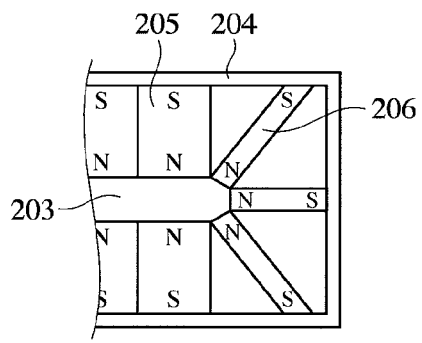
FIG. 11(d) is a plan view showing a still further example of the shapes of an end portion of a center magnetic pole member and a peripheral magnetic pole member in each corner portion, in the second magnetic-field-generating apparatus for magnetron sputtering according to the present invention.

The center magnetic pole member 203 is formed by a rod-shaped, soft-magnetic body when viewed from above, and their both end portions may be circular [see FIG. 11(a)] or polygonal [see FIGS. 11(b) and 11(c)]. In the case of a polygonal end portion, a tetragonal shape [FIG. 11(b)], a hexagonal shape [FIG. 11(c)], etc. are preferable, though not restrictive. Both end portions of the center magnetic pole member 203 preferably have shapes corresponding to those of the permanent magnets 206 arranged in the corner portions.

The peripheral magnetic pole member 204 is preferably formed by a soft-magnetic body, which has a semicircular [see FIG. 10(a)] or polygonal shape in each corner portion. For the easiness of production, the corner portions more preferably have a polygonal shape. Though not particularly restrictive, the polygonal shape is preferably a hexagonal shape shown in FIG. 11(c), a tetragonal shape shown in FIG. 11(d), etc., and the hexagonal shape is more preferable. The corner portions of the peripheral magnetic pole member 204 need not have a shape corresponding to the shape of both end portions of the center magnetic pole member 203, but may be designed separately. Their combinations are shown in FIGS. 10 and 11(a)-11(d), though the present invention is not restricted thereto.

Known magnetic materials (soft-magnetic materials), such as steel, magnetic stainless steel, etc., may be used for the center magnetic pole member 203 and the peripheral magnetic pole member 204.

Figure 12:
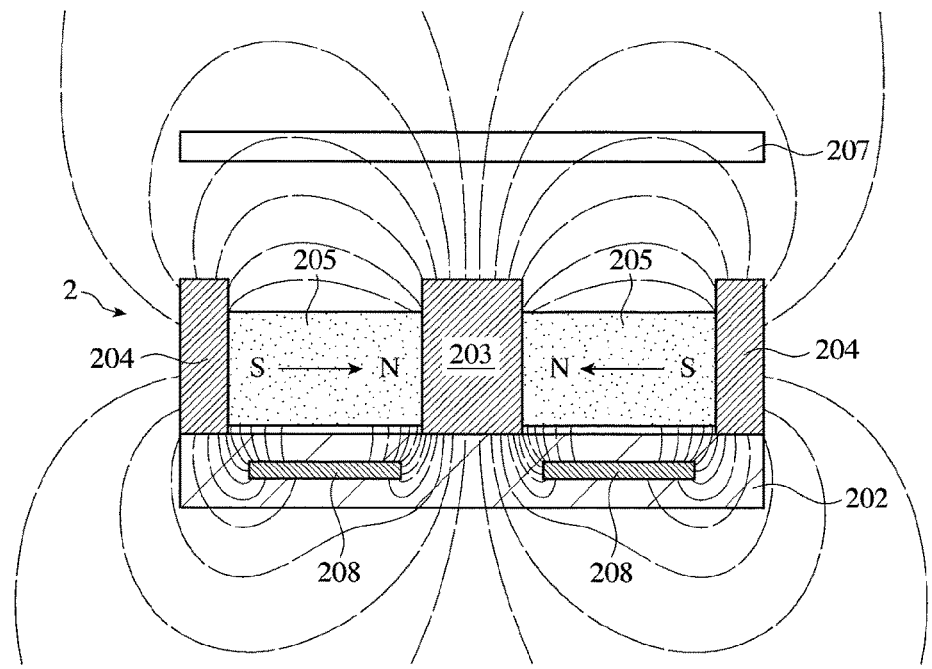
FIG. 12 is a schematic cross-sectional view showing magnetic flux lines generated from the second magnetic-field-generating apparatus for magnetron sputtering according to the present invention.

Magnetic flux lines generated from the magnetic-field-generating apparatus 2 of the present invention are shown in FIG. 12. Magnetic flux lines generated from the N pole of each permanent magnet pass through the center magnetic pole member 203, flow from its upper surface 203a [see FIG. 10(b)] to the target 207 and to an upper surface 204a of each peripheral magnetic pole member 204 [see FIG. 10(b)], and return to the S pole of each permanent magnet. Magnetic flux passing above the permanent magnets forms a racetrack-shaped distribution of a magnetic field when viewed from above, which is perpendicular to an electric field near electrodes. On the other hand, magnetic flux lines flowing from a lower surface 203b of the center magnetic pole member 203 [see FIG. 10(b)] pass through the non-magnetic base 202, partially through the magnetic shunts 208, and return to a lower surface 204b of each peripheral magnetic pole member 204 [see FIG. 10(b)].

Figure 13:
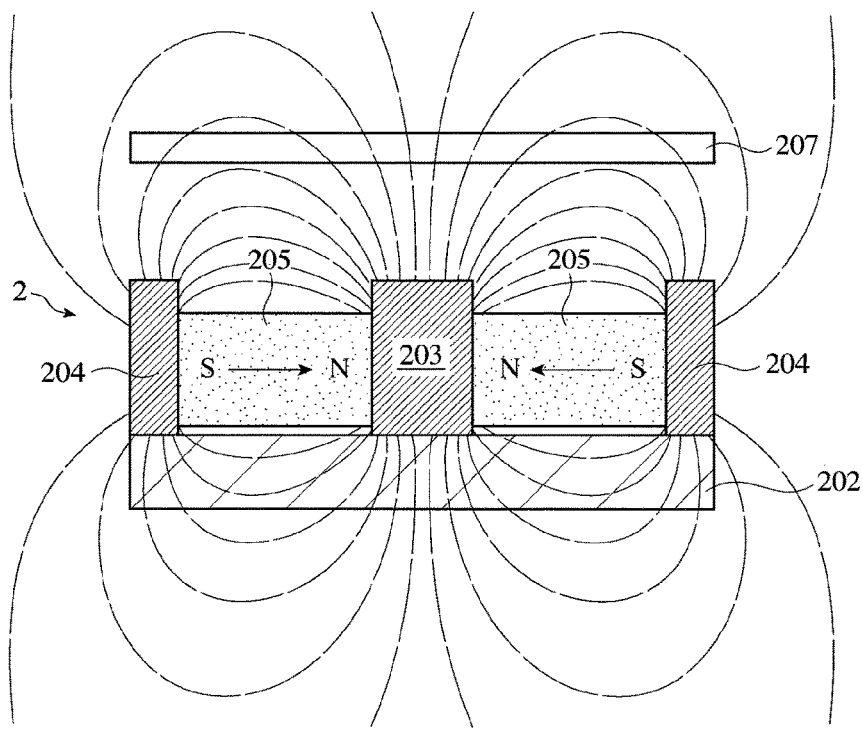
FIG. 13 is a schematic cross-sectional view showing magnetic flux lines generated from a conventional magnetic-field-generating apparatus for magnetron sputtering.

In a conventional magnetic-field-generating apparatus as shown in FIG. 13, however, a magnetic path in the base 202 has higher magnetic resistance than that of the magnetic-field-generating apparatus 2 of the present invention, because it does not comprise magnetic shunts in a non-magnetic base 202. As a result, the amount of magnetic flux flowing on the side of the target 207 is higher.

Figure 14:
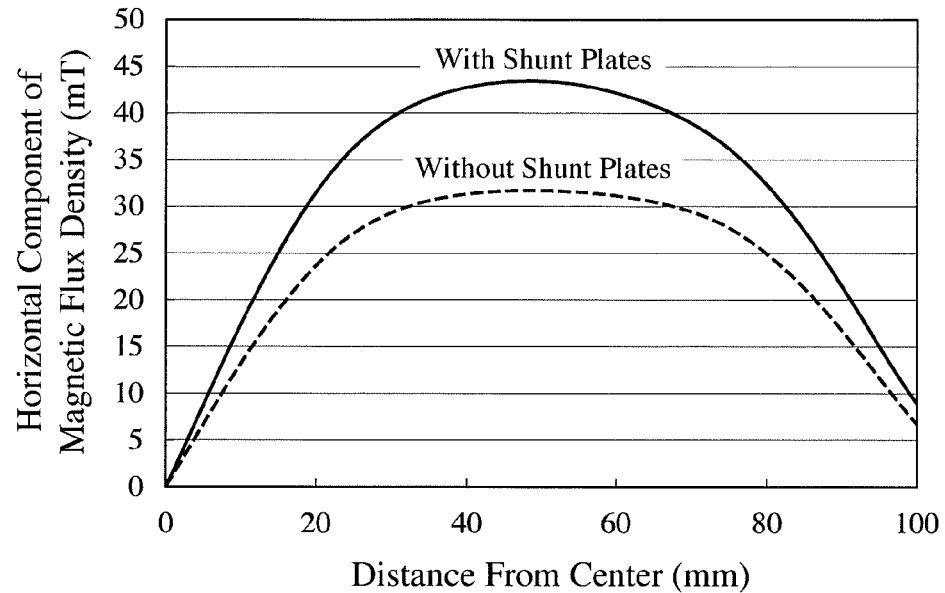
FIG. 14 is a graph showing a horizontal component of a magnetic flux density of a magnetic field on a target surface determined by simulation, the magnetic field being generated by each magnetic-field-generating apparatus shown in FIGS. 12 and 13.

A horizontal component of a magnetic flux density on a target surface was determined by magnetic field simulation using a finite element method from magnetic flux generated by each magnetic-field-generating apparatus 2 shown in FIGS. 12 and 13, and plotted against the distance from a center of the center magnetic pole member 203 in a direction to the peripheral magnetic pole member 204 in FIG. 14. Used as the magnetic shunts 208 in the structure shown in FIG. 12 were 2.5-mm-thick plates of SUS430. As is clear from FIG. 14, a magnetic field on a target surface was as small as 32 mT in the structure shown in FIG. 12 comprising the magnetic shunts 208, reduced from 43 mT in the structure shown in FIG. 13 comprising no shunt plates.

Figure 29:
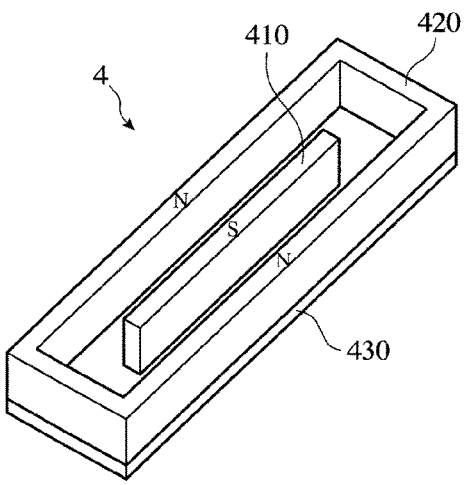
FIG. 29 is a perspective view showing an example of conventional magnetic-field-generating apparatuses for magnetron sputtering.
Figure 30:
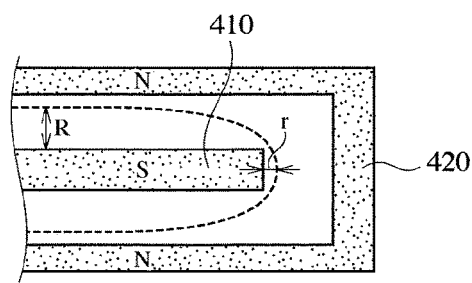
FIG. 30 is a schematic view showing a portion in which a perpendicular component of a magnetic flux density on a target surface is zero, in a magnetic field generated by a conventional magnetic-field-generating apparatus for magnetron sputtering.

As described above, the second magnetic-field-generating apparatus 2 for magnetron sputtering according to the present invention comprises a magnetic circuit constituted by magnets arranged with their magnetization directions in parallel to a target surface, and the magnetic shunts 208 disposed on the opposite side of the target with respect to the magnets. However, in the case of a conventional magnetic circuit comprising magnets arranged with their magnetization directions perpendicular to a target surface as shown in FIG. 29, a magnetic field cannot be adjusted by the magnetic shunts arranged on the base side, because of the magnetic base disposed on the opposite side of the target with respect to magnets. However, when part of a conventional magnetic circuit is substituted by a magnetic circuit comprising magnets with magnetization in parallel to a target surface to constitute a magnetic-field-generating apparatus, a magnetic field can be adjusted by the magnetic shunts 208 disposed on the non-magnetic base side, in a magnetic circuit part comprising magnets with magnetization in parallel to a target surface, like the second magnetic-field-generating apparatus 2 for magnetron sputtering according to the present invention.

(2) Magnetic Shunts

In the magnetic-field-generating apparatus 2 of the present invention, the intensity and direction of a magnetic field generated from the permanent magnets can be adjusted by the magnetic shunts 208 disposed in the non-magnetic base 202. For example, in the conventional magnetic-field-generating apparatus shown in FIG. 13, which does not comprise the magnetic shunts 208, a smaller amount of magnetic flux lines flow to the base 202, while a larger amount of magnetic flux lines flow to the target 207, resulting in a higher-intensity magnetic field on the target 207. As a result, local erosion is likely to proceed on the target 207. As shown in FIG. 12, the arrangement of the magnetic shunts 208 in the base 202 reduces the magnetic resistance of magnetic paths in the base 202, resulting in a larger amount of magnetic flux on the side of the base 202. On the other hand, the magnetic resistance of magnetic paths on the side of the target 207 is larger than that on the side of the base 202, resulting in a smaller amount of magnetic flux and thus a weaker magnetic field on the side of the target 207. Thus, the erosion of the target 207 can be suppressed.

The magnetic shunts 208 are disposed on the opposite side of the target 207 with respect to the permanent magnets 205 for the linear portion and the permanent magnets 206 for the corner portions. Though the amount of magnetic flux lines can be adjusted even when the magnetic shunts 208 are disposed on the same side as the target 207, the magnetic-field-generating apparatus 2 should be disassembled with vacuum released to dispose the magnetic shunts 208 on the side of the target 207. Once the magnetic shunts 208 are disposed, they are not easily removed, making it impossible to adjust the amount of magnetic flux lines during sputtering. On the other hand, in the structure in which the magnetic shunts 208 are disposed on the side of the base 202, the magnetic shunts 208 can be removed by a simple operation, so that a magnetic field can be adjusted by changing the size, thickness, soft-magnetic properties, etc. of the magnetic shunts 208 depending on the type of a sputtering target 207, sputtering conditions, etc. Also, the arrangement of the magnetic shunts 208 on the side of the base 202 reduces the amount of magnetic flux leaking from a rear surface of the base 202.

Figure 15A:
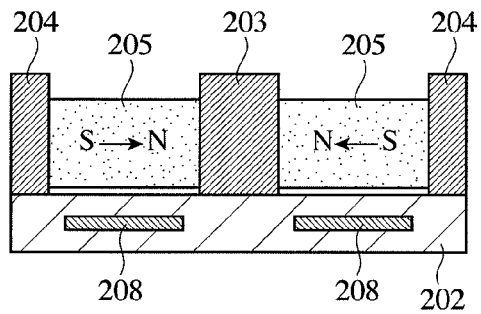
FIG. 15(a) is a cross-sectional view schematically showing an example of the arrangements of magnetic shunts in the second magnetic-field-generating apparatus for magnetron sputtering according to the present invention.
Figure 15B:
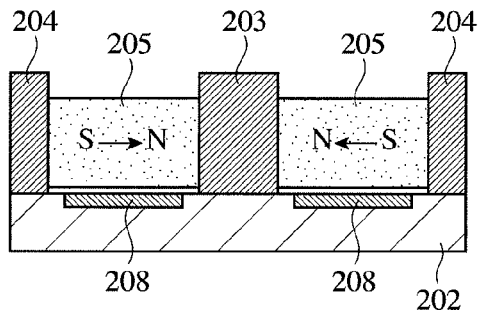
FIG. 15(b) is a cross-sectional view schematically showing another example of the arrangements of magnetic shunts in the second magnetic-field-generating apparatus for magnetron sputtering according to the present invention.
Figure 15C:
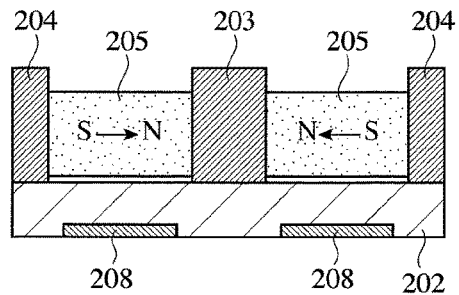
FIG. 15(c) is a cross-sectional view schematically showing a further example of the arrangements of magnetic shunts in the second magnetic-field-generating apparatus for magnetron sputtering according to the present invention.
Figure 15D:
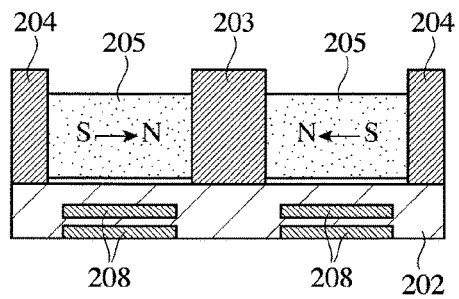
FIG. 15(d) is a cross-sectional view schematically showing a still further example of the arrangements of magnetic shunts in the second magnetic-field-generating apparatus for magnetron sputtering according to the present invention.
Figure 15E:
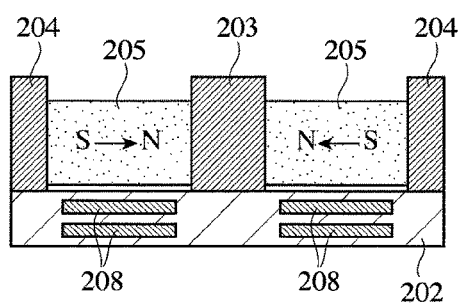
FIG. 15(e) is a cross-sectional view schematically showing a still further example of the arrangements of magnetic shunts in the second magnetic-field-generating apparatus for magnetron sputtering according to the present invention.
Figure 15F:
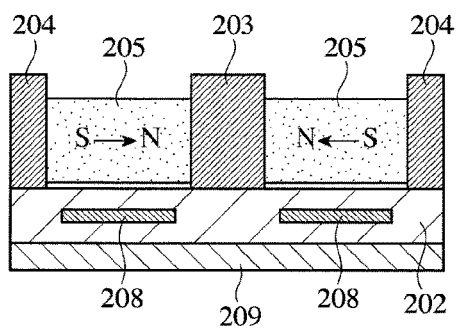
FIG. 15(f) is a cross-sectional view schematically showing a still further example of the arrangements of magnetic shunts in the second magnetic-field-generating apparatus for magnetron sputtering according to the present invention.

The magnetic shunts 208 are disposed preferably in the base 202 [FIG. 15(a)], or on an upper surface [FIG. 15(b)] or a lower surface [FIG. 15(c)] of the base 202, and may be disposed in two or more layers [FIGS. 15(d) and 15(e)]. These arrangements may be properly selected depending on the purpose of sputtering, the type of a target 207, etc. A magnetic shield plate 209 may be disposed below the base 202 having the magnetic shunts 208 [FIG. 15(*f*)].

Figure 16A:
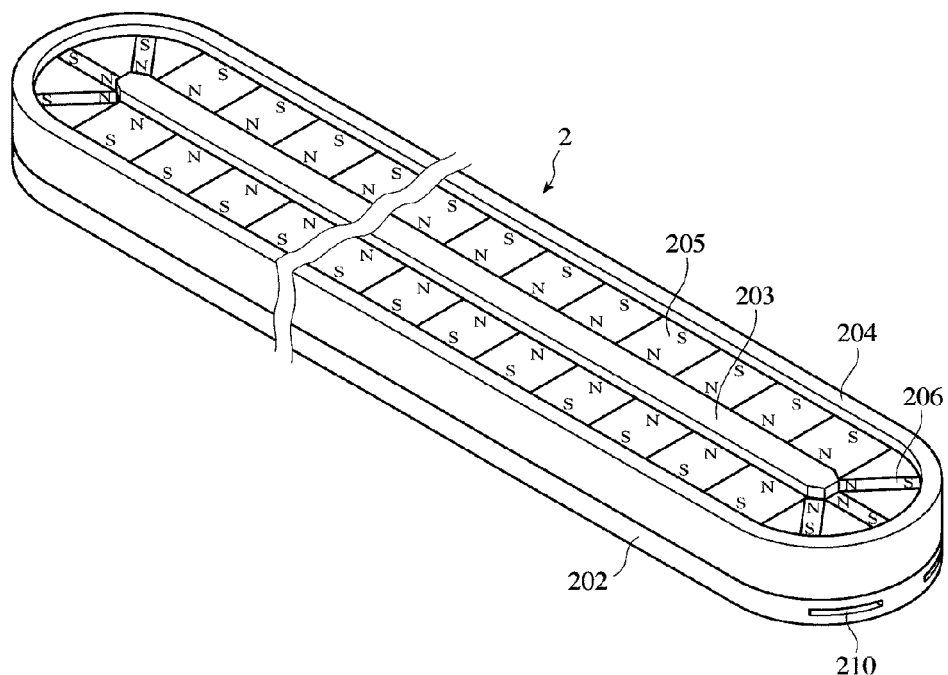
FIG. 16(a) is a perspective view schematically showing an example of the second magnetic-field-generating apparatuses for magnetron sputtering according to the present invention, which has holes into which magnetic shunts are inserted.
Figure 16B:
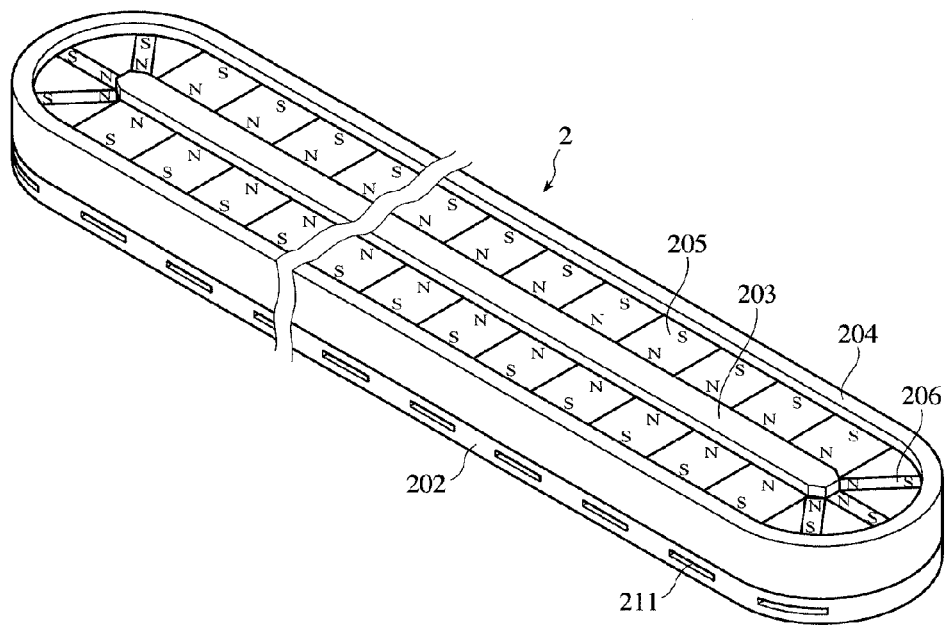
FIG. 16(b) is a perspective view schematically showing another example of the second magnetic-field-generating apparatuses for magnetron sputtering according to the present invention, which has holes into which magnetic shunts are inserted.
Figure 17A:
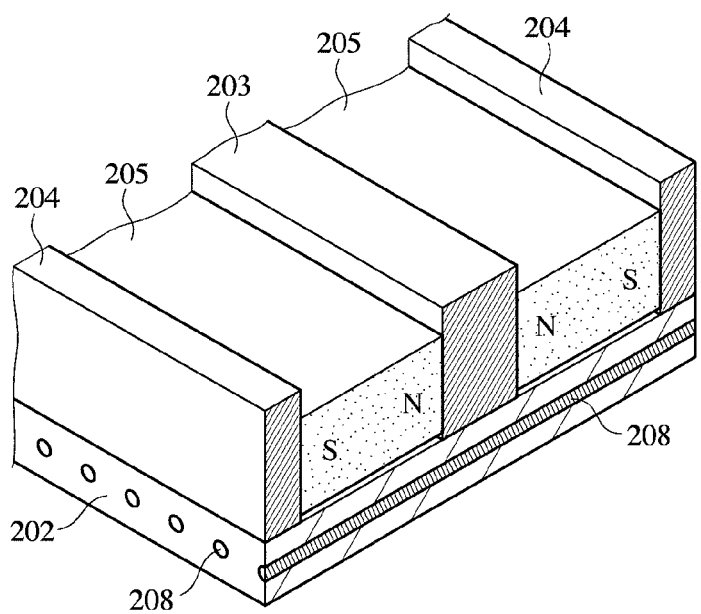
FIG. 17(a) is a partially cross-sectional perspective view schematically showing an example of the second magnetic-field-generating apparatuses for magnetron sputtering according to the present invention, which has magnetic shunts.
Figure 17B:
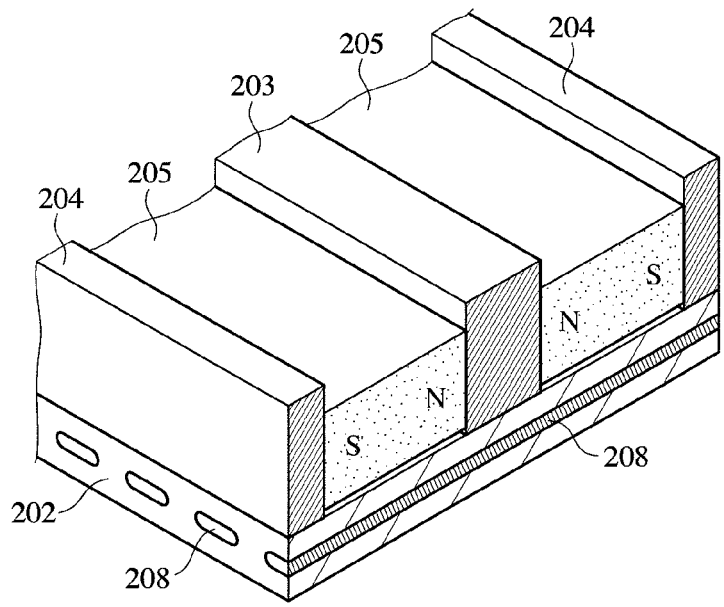
FIG. 17(b) is a partially cross-sectional perspective view schematically showing another example of the second magnetic-field-generating apparatuses for magnetron sputtering according to the present invention, which has magnetic shunts.

As shown in FIG. 16(*a*), the magnetic shunts 208 insertable into the base 202 through holes 210 opening on a transverse side surface of the base 202 are easily detachable. As shown in FIG. 16(*b*), the magnetic shunts 208 may also be insertable into the base 202 through pluralities of holes 211 opening at constant intervals on a longitudinal side surface of the base 202. In this case, the magnetic shunts 208 are longitudinally arranged with gaps in the magnetic-field-generating apparatus 2. In a magnetic circuit constituted by a center magnetic pole member 203, a peripheral magnetic pole member 204, and permanent magnets 205 for a linear portion and permanent magnets 206 for corner portions with their magnetization directions in parallel to a surface of a target 207 as in the magnetic-field-generating apparatus 2 of the present invention, unevenness to some extent is averaged by the center magnetic pole member 203 and peripheral magnetic pole member 204, the magnetic shunts 208 need not necessarily be disposed continuously in a longitudinal direction, but may be arranged intermittently. Each magnetic shunt 208 may have a cylindrical cross section as shown in FIG. 17(*a*), or a racetrack-shaped cross section as shown in FIG. 17(*b*).

When the magnetic shunts 208 are inserted into the base 202 through holes 210, 211 opening on a side surface as shown in FIGS. 16(*a*) and 16(*b*), all magnetic shunts 208 need not be the same, but may be a combination of those having different soft-magnetic properties, for example. The use of a combination of magnetic shunts 208 of different types makes it possible to finely adjust a magnetic field generated by the magnetic-field-generating apparatus 2. Particularly, when the magnetic shunts 208 are inserted into the racetrack-shaped base 202 through holes 211 opening on a longitudinal side surface, magnetic shunts 208 disposed in the linear portion and those disposed in the corner portions may have different soft-magnetic properties, thicknesses, sizes, etc., to obtain a more uniform magnetic field.

Figure 18:
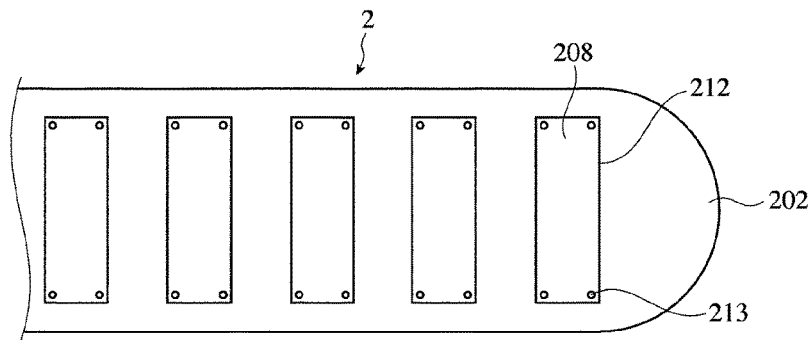
FIG. 18 is a schematic view showing from the base side a further example of the second magnetic-field-generating apparatuses for magnetron sputtering according to the present invention, which has magnetic shunts.

As shown in FIG. 15(*c*) or 15(*d*), when the magnetic shunts 208 are disposed on a lower surface of the base 202, the lower surface of the base 202 may be provided with recesses 212 for receiving the magnetic shunts 208, which are fixed to the recess 212 by screws 213, as shown in FIG. 18, to make the magnetic shunts 208 easily detachable.

Figure 19A:
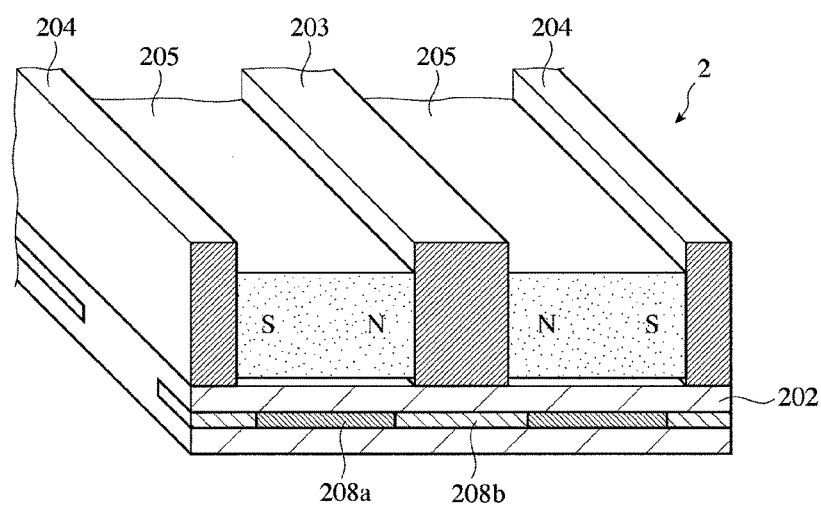
FIG. 19(a) is a partially cross-sectional perspective view schematically showing a still further example of the second magnetic-field-generating apparatuses for magnetron sputtering according to the present invention, which has magnetic shunts.
Figure 19B:
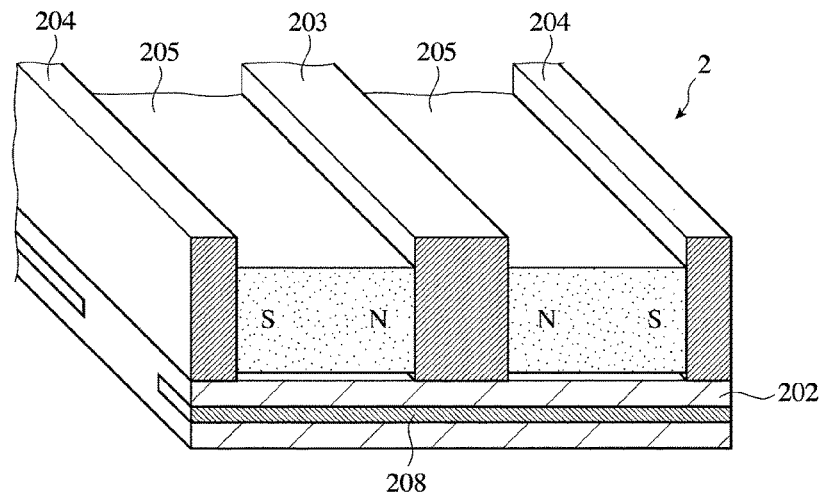
FIG. 19(b) is a partially cross-sectional perspective view schematically showing a still further example of the second magnetic-field-generating apparatuses for magnetron sputtering according to the present invention, which has magnetic shunts.
Figure 19C:
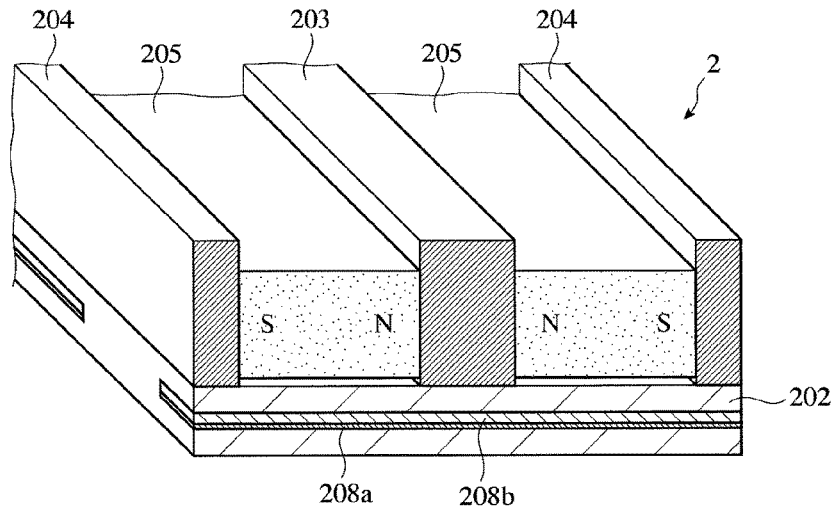
FIG. 19(c) is a partially cross-sectional perspective view schematically showing a still further example of the second magnetic-field-generating apparatuses for magnetron sputtering according to the present invention, which has magnetic shunts.
Figure 20A:
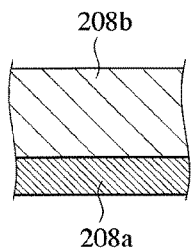
FIG. 20(a) is a partial cross-sectional view schematically showing an example of laminate shunt plates comprising a magnetic portion and a non-magnetic spacer.
Figure 20B:
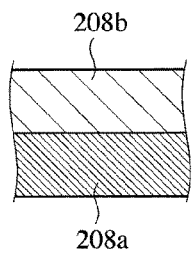
FIG. 20(b) is a partial cross-sectional view schematically showing another example of laminate shunt plates comprising a magnetic portion and a non-magnetic spacer.
Figure 20C:
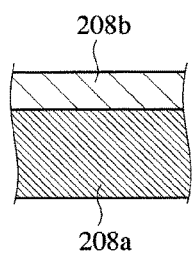
FIG. 20(c) is a partial cross-sectional view schematically showing a further example of laminate shunt plates comprising a magnetic portion and a non-magnetic spacer.
Figure 20D:
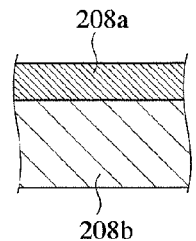
FIG. 20(d) is a partial cross-sectional view schematically showing a still further example of laminate shunt plates comprising a magnetic portion and a non-magnetic spacer.

Each magnetic shunt 208 may be a plate comprising magnetic portions 208*a* and non-magnetic spacer 208*b* such that magnetic bodies are arranged only in portions with a high magnetic flux density in the base 202 as shown in FIG. 19(*a*), or a transversely integral magnetic plate as shown in FIG. 19(*b*).

As shown in FIG. 19(*c*), each magnetic shunt 208 may be a laminate of a magnetic portion 208*a* and a non-magnetic spacer 208*b*. In this case, the thickness of the magnetic portion 208*a* may be changed with their total thickness unchanged as shown in FIGS. 20(*a*)-20(*c*), to adjust a magnetic field finely. Further, the magnetic portion 208*a* may be arranged on the upper side [closer to the permanent magnets as shown in FIG. 20(*d*)] or on the lower side [more distant from the permanent magnets as shown in FIG. 20(*a*)], to finely adjust the magnetic field. The total thickness of the magnetic portion 208*a* and the non-magnetic spacer 208*b* is set equal to the thickness of the hole 210, 211 in the base 202, such that a laminate plate of the magnetic portion 208*a* and the non-magnetic spacer 208*b* is firmly fixed.

Figure 21A:
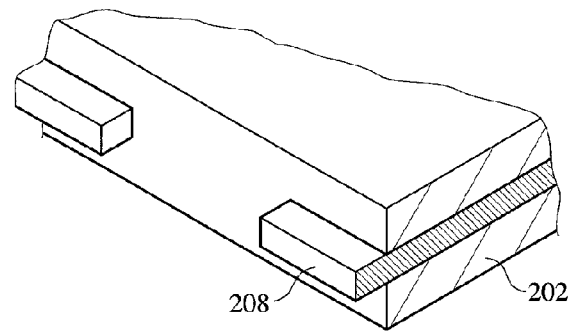
FIG. 21(a) is a partially cross-sectional perspective view schematically showing a still further example of magnetic shunts in the second magnetic-field-generating apparatus for magnetron sputtering according to the present invention.
Figure 21B:
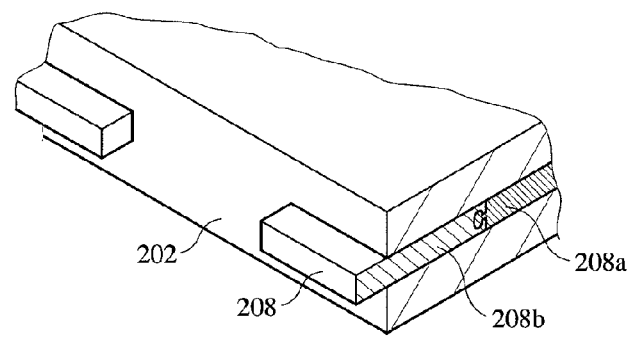
FIG. 21(b) is a partially cross-sectional perspective view schematically showing a still further example of magnetic shunts in the second magnetic-field-generating apparatus for magnetron sputtering according to the present invention.
Figure 21C:
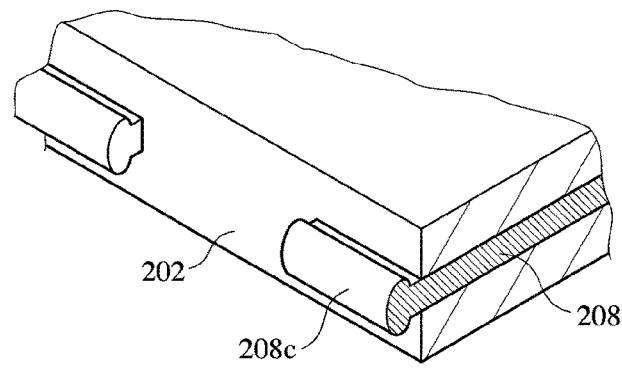
FIG. 21(c) is a partially cross-sectional perspective view schematically showing a still further example of magnetic shunts in the second magnetic-field-generating apparatus for magnetron sputtering according to the present invention.

The magnetic shunts 208 preferably have a shape permitting easy exchange. For example, as shown in FIG. 21(*a*), they preferably have such length that they slightly project from the holes 210, 211 of the base 202, into which they are inserted. Further, a projecting portion may be the non-magnetic spacer 208*b* as shown in FIG. 21(*b*), or the projecting portion may have a ridge portion 208*c* as shown in FIG. 21(*c*) to make it easy to remove the magnetic shunt 208 from the hole 210, 211.

Known magnetic materials (soft-magnetic materials) such as steel, magnetic stainless steel, etc. may be used for the magnetic shunts 208.

(3) Permanent Magnets

The permanent magnets may be formed by known permanent magnet materials. Particularly to obtain a high magnetic flux density, it is preferable to use rare earth magnets, more preferably anisotropic sintered R-T-B magnets comprising R (at least one of rare earth elements such as Nd), T (Fe or Fe and Co) and B as indispensable components, which are subject to various surface treatments for corrosion resistance.

[3] Third Magnetic-Field-Generating Apparatus for Magnetron Sputtering

The structure of the magnetic-field-generating apparatus for magnetron sputtering according to the present invention is not restricted to a racetrack shape (the second magnetic-field-generating apparatus 2 for magnetron sputtering).

Figure 22A:
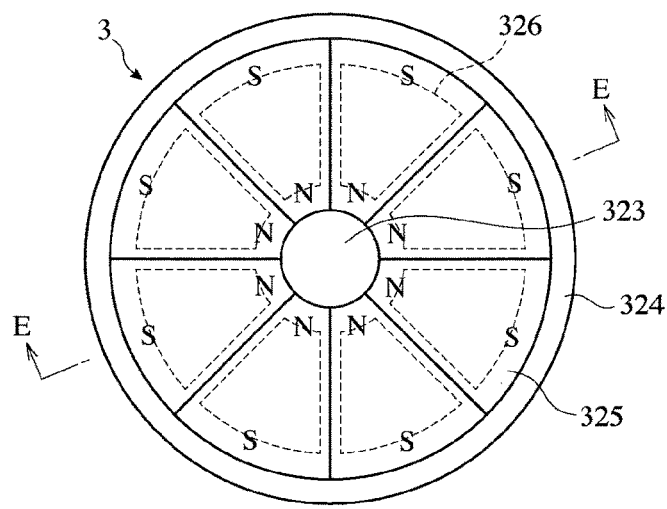
FIG. 22(a) is a plan view showing an example of the third magnetic-field-generating apparatuses for magnetron sputtering according to the present invention.
Figure 22B:
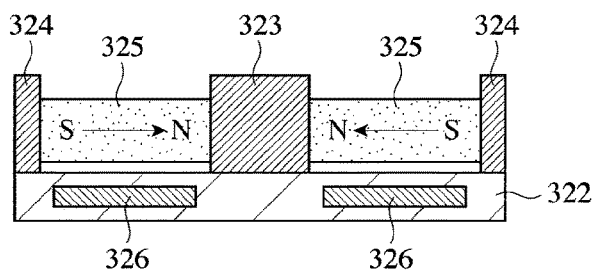
FIG. 22(b) is a cross-sectional view taken along the line E-E in FIG. 22(a).

Another example of the magnetic-field-generating apparatuses for magnetron sputtering is a circular magnetic-field-generating apparatus for magnetron sputtering, which is the third magnetic-field-generating apparatus 3 for magnetron sputtering, as shown in FIGS. 22(*a*) and 22(*b*). The third magnetic-field-generating apparatus 3 for magnetron sputtering comprises a non-magnetic base 322; a circular center magnetic pole member 323 disposed on a surface of the non-magnetic base 322; an annular peripheral magnetic pole member 324 disposed around the center magnetic pole member 323; plural permanent magnets 325 arranged with their magnetization in parallel to a target surface between the center magnetic pole member 323 and the peripheral magnetic pole member 324, such that their magnetic poles of the same polarity are opposing the center magnetic pole member 323; and magnetic shunts 326 arranged on the side of the base 322 with respect to the permanent magnets 325 for adjusting a magnetic field on a target surface [shown by dotted lines in FIG. 22(*a*)]. The magnetic shunts 326 may have any shapes as long as they can adjust the intensity of a magnetic field generated from the permanent magnets 325, specifically a fan shape shown by a dotted line in FIG. 22(*a*), or a circular ring shape (not shown) formed by connecting the fan shapes. All permanent magnets 325 need not be provided with magnetic shunts 326.

The third magnetic-field-generating apparatus 3 for magnetron sputtering is essentially the same as the second magnetic-field-generating apparatus 2 for magnetron sputtering, except that it has a circular shape, and the arrangement of the magnetic shunts 326 on the side of the non-magnetic base 322 makes it possible to adjust a magnetic field by a simple operation as in the second magnetic-field-generating apparatus 2 for magnetron sputtering.

The present invention will be explained in more detail referring to Examples below without intention of restriction.

Comparative Example 1

Figure 23A:
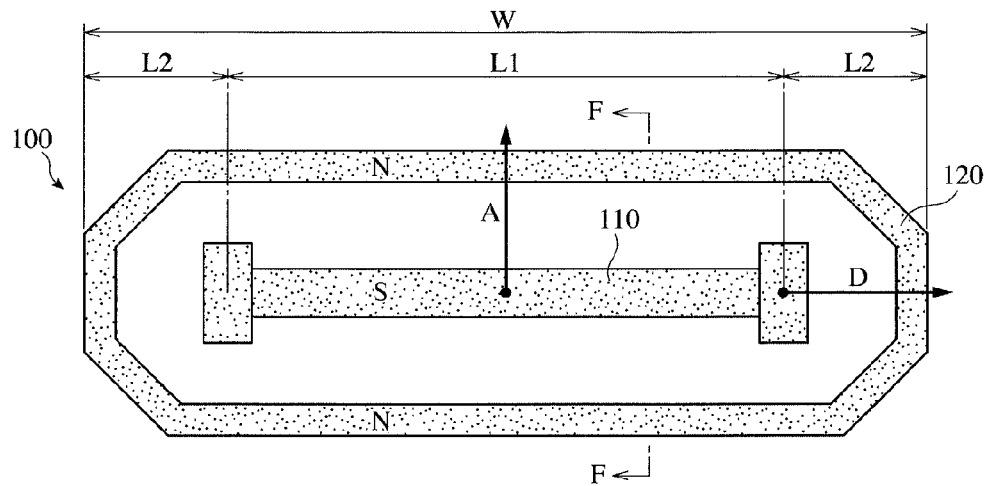
FIG. 23(a) is a plan view showing the magnetic-field-generating apparatus of Comparative Example 1.
Figure 23B:
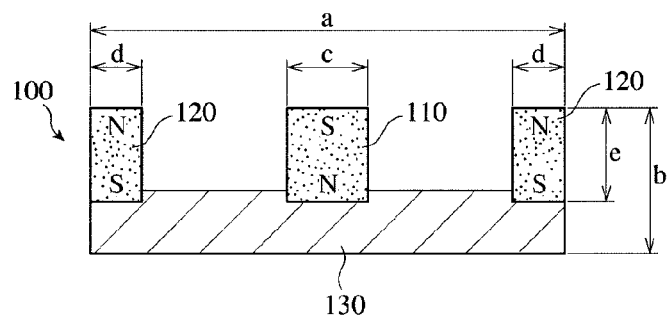
FIG. 23(b) is a cross-sectional view taken along the line F-F in FIG. 23(a).
Figure 24:
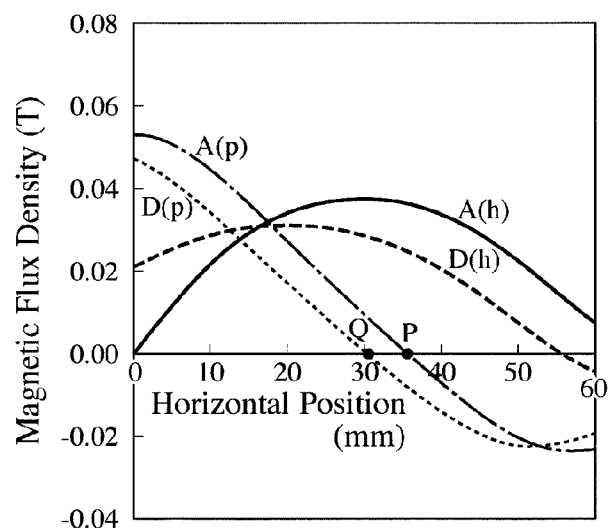
FIG. 24 is a graph showing magnetic flux density distributions provided by the magnetic-field-generating apparatus of Comparative Example 1.

As shown in FIGS. 23(*a*) and 23(*b*), a magnetic-field-generating apparatus 100, in which W=300 mm, L1=200 mm, L2=50 mm, a=100 mm, b=50 mm, c=20 mm, d=10 mm, and e=30 mm, was produced, using a yoke 130 formed by a steel plate (SS400), a center magnet 110 and a peripheral magnet 120 each formed by an anisotropic sintered R-T-B magnet (NMX50AH available from Hitachi Metals, Ltd., maximum energy product: 50 MGOe or more). Horizontal and perpendicular components of a magnetic flux density at a height of 20 mm (corresponding to the height of a target surface) from a surface of the magnetic-field-generating apparatus 100 were measured along lines A and D by magnetic field analysis. The results are shown in FIG. 24.

In the figure, A(h) and D(h) represent the measurement results of the horizontal component of the magnetic flux density along the lines A and D, and A(p) and D(p) represent the measurement results of the perpendicular component of the magnetic flux density along the lines A and D. P and Q represent points at which the perpendicular component of the magnetic flux density was zero on the lines A and D. In Comparative Example 1, the points Q and P were 30 mm and 35 mm, respectively, indicating that a point at which the perpendicular component of the magnetic flux density was zero in the corner portion was located inside the corresponding point in the linear portion.

Example 1

Figure 25A:
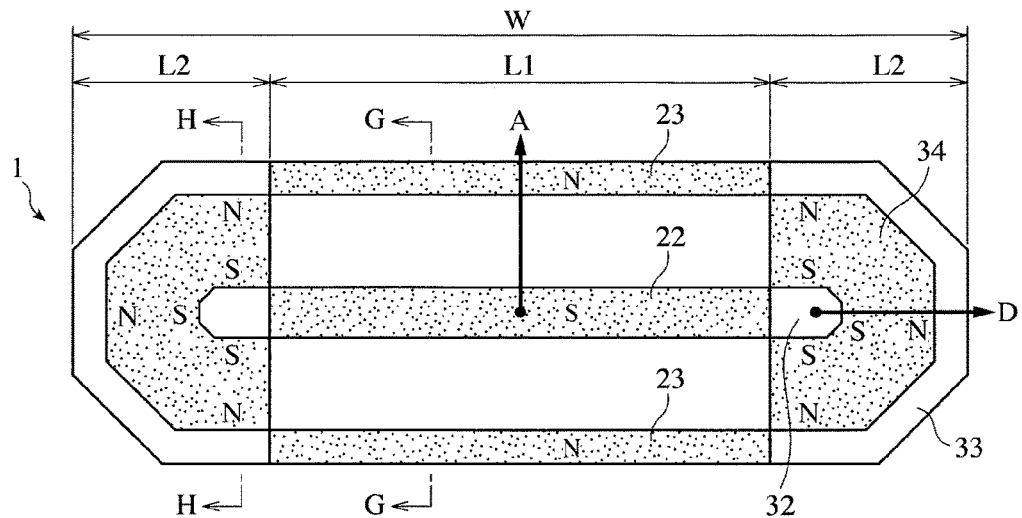
FIG. 25(a) is a plan view showing the magnetic-field-generating apparatus of Example 1.
Figure 25B:
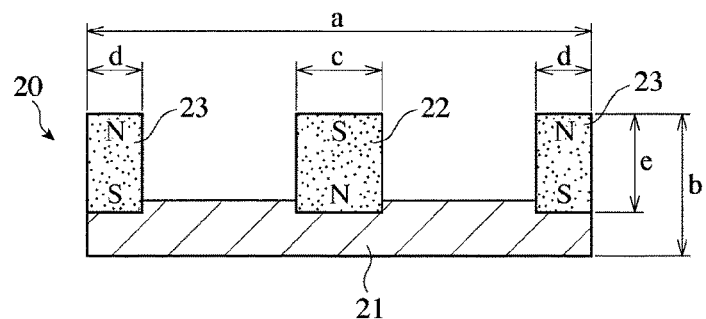
FIG. 25(b) is a cross-sectional view taken along the line G-G in FIG. 25(a).
Figure 25C:
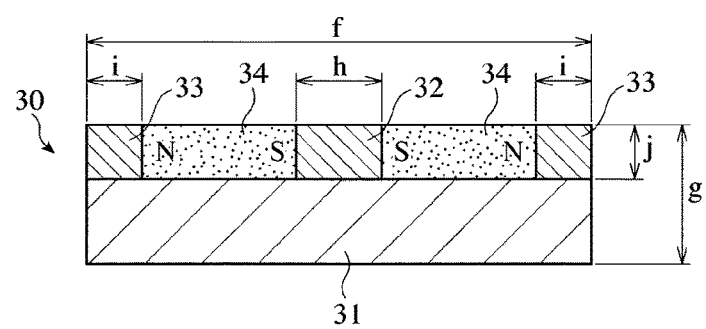
FIG. 25(c) is a cross-sectional view taken along the line H-H in FIG. 25(a).

As shown in FIGS. 25(a), 25(b) and 25(c), a linear portion 20 comprising a yoke 21 formed by a steel plate (SS400), and a center permanent magnet 22 and side permanent magnets 23 formed by anisotropic sintered R-T-B magnets (NMX50AH available from Hitachi Metals, Ltd. having a maximum energy product of 50 MGOe or more), and corner portions 30 each comprising a base 31 made of austenitic stainless steel (SUS304), a center magnetic pole member 32 and a peripheral magnetic pole member 33 each formed by a steel plate (SS400), and permanent magnets 34 formed by anisotropic sintered R-TM-B magnets (NMX50AH available from Hitachi Metals, Ltd. having a maximum energy product of 50 MGOe or more) were assembled to produce a magnetic-field-generating apparatus 1, in which W=300 mm, L1=200 mm, L2=50 mm, a=100 mm, b=50 mm, c=20 mm, d=10 mm, e=30 mm, f=100 mm, g=50 mm, h=20 mm, i=10 mm, and j=10 mm. Horizontal and perpendicular components of a magnetic flux density at a height of 20 mm (corresponding to the height of a target surface) from a surface of the magnetic-field-generating apparatus 1 were measured along lines A and D by magnetic field analysis. The results are shown in FIG. 26.

In the figure, A(h) and D(h) represent the measurement results of the horizontal component of the magnetic flux density along the lines A and D, and A(p) and D(p) represent the measurement results of the perpendicular component of the magnetic flux density along the lines A line D. P and Q represent points at which the perpendicular component of the magnetic flux density was zero on the lines A and D. In Example 1, the points Q and P were 43 mm and 37 mm, respectively, indicating that a point at which the perpendicular component of the magnetic flux density was zero in the corner portions shifted outward (toward the peripheral magnetic pole member in the corner portion).

Example 2

Points P and Q, at which a perpendicular component of a magnetic flux density on a target surface was zero, were measured along the lines A and D in the same manner as in Example 1, except for changing the arrangement of magnets in each corner portion as shown in FIG. 4 in the magnetic-field-generating apparatus 1 of Example 1 (see FIG. 25). The occupation ratio of magnets in the corner portion, which was a ratio of an area occupied by the permanent magnets to the area of space between the center magnetic pole member and the peripheral magnetic pole member, was 50%. In this structure, points P and Q were 37 mm and 43 mm, respectively, the same as in the magnetic-field-generating apparatus 1 of Example 1.

Example 3

Points P and Q, at which a perpendicular component of a magnetic flux density on a target surface was zero, were measured along the lines A and D in the same manner as in Example 1, except for changing the arrangement of magnets in each corner portion as shown in FIG. 5 in the magnetic-field-generating apparatus 1 of Example 1 (see FIG. 25). The occupation ratio of magnets in the corner portion was 50%. In this structure, the points P and Q were 37 mm and 42 mm, respectively, substantially the same as in Example 1.

Example 4

Points P and Q, at which a perpendicular component of a magnetic flux density on a target surface was zero, were measured along the lines A and D in the same manner as in Example 1, except for using a magnetic-field-generating apparatus having a structure as shown in FIG. 9, which had the same widths d and c of magnets in the linear portion as in the magnetic-field-generating apparatus 1 of Example 1 (see FIG. 25), and the width of the yoke 21, which was expanded on both sides evenly by 5 mm (a=110 mm) to increase the distance between the center permanent magnet 22 and the side permanent magnet 23. In this structure, both points P and Q were 43 mm.

Example 5

Points P and Q, at which a perpendicular component of a magnetic flux density on a target surface was zero, were measured along the lines A and D in the same manner as in Example 4, except for changing the arrangement of magnets in each corner portion as used in Example 2 (see FIG. 4) in the magnetic-field-generating apparatus of Example 4. In this structure, both points P and Q were 43 mm.

Table 1 shows the points P and Q in Examples 1-5 and Comparative Example 1. These results indicate that while the point Q was smaller than the point P in distance in Comparative Example, indicating that points (erosion line) at which a perpendicular component of a magnetic flux density in each corner portion was zero were shifted inward, the point Q was equal to or larger than the point P in distance in Examples 1-5, indicating that the erosion line in each corner portion was shifted outward. Thus, uniform erosion was achieved in both linear portion and corner portions in the magnetic-field-generating apparatuses of Examples 1-5, resulting in improved efficiency of utilizing the target.

TABLE 1

| No. | Point P | Point Q |
|---|---|---|
| Example 1 | 37 mm | 43 mm |
| Example 2 | 37 mm | 43 mm |
| Example 3 | 37 mm | 42 mm |
| Example 4 | 43 mm | 43 mm |
| Example 5 | 43 mm | 43 mm |
| Comparative Example 1 | 35 mm | 30 mm |

Example 6

Figure 27:
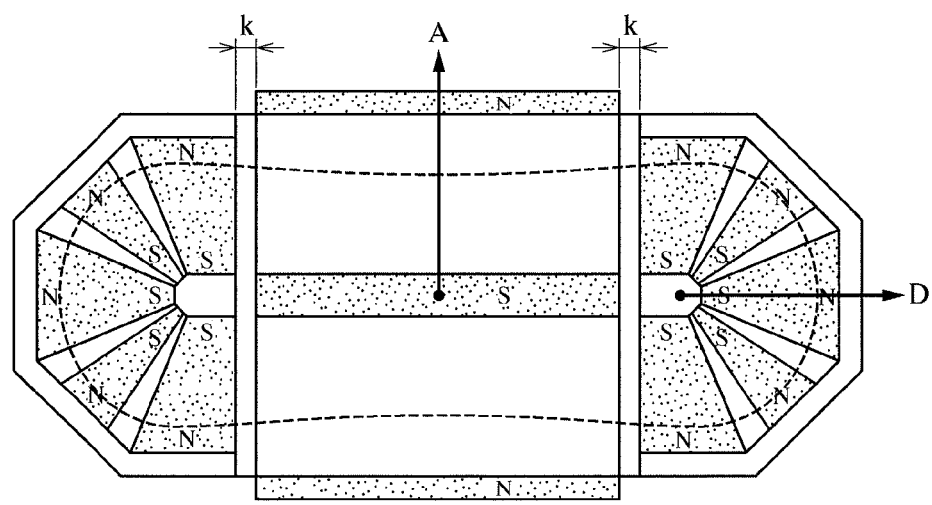
FIG. 27 is a schematic view showing points at which a perpendicular component of a magnetic flux density on a target surface is zero, in a magnetic field generated by the magnetic-field-generating apparatus of Example 6.

Points at which a perpendicular component of a magnetic flux density on a target surface was zero were measured in the same manner as in Example 5, except for changing the arrangement of magnets in each corner portion as shown in FIG. 27 in the magnetic-field-generating apparatus of Example 5, and shown by a dotted line in FIG. 27. In this structure, the distance k between the linear portion and each corner portion was 5 mm, and the occupation ratio of magnets in the corner portions was 75%.

Example 7

Figure 28:
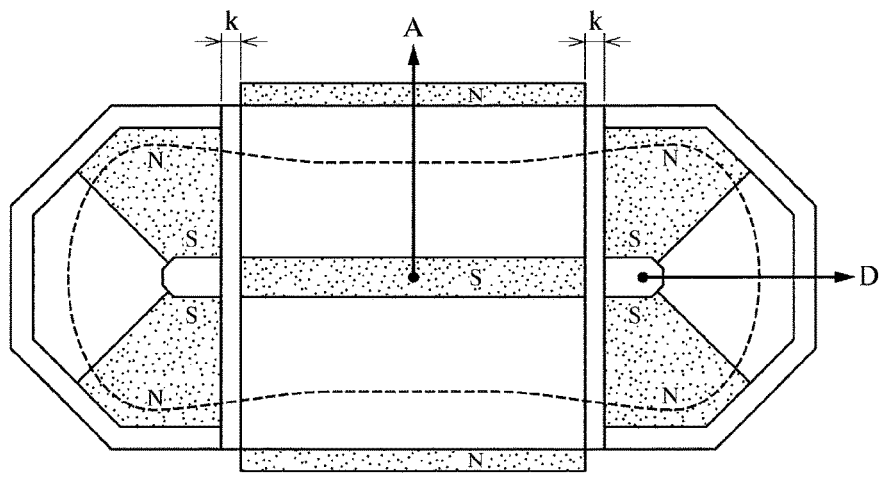
FIG. 28 is a schematic view showing points at which a perpendicular component of a magnetic flux density on a target surface is zero, in a magnetic field generated by the magnetic-field-generating apparatus of Example 7.

Points at which a perpendicular component of a magnetic flux density on a target surface was zero were measured in the same manner as in Example 5, except for changing the arrangement of magnets in each corner portion as shown in FIG. 28 in the magnetic-field-generating apparatus of Example 5, and shown by a dotted line in FIG. 28. In this structure, the distance k between the linear portion and each corner portion was 5 mm, and the occupation ratio of magnets in the corner portions was 50%.

When the magnetic-field-generating apparatuses of Examples 1-7 were used, a horizontal component of a magnetic flux density at points at which a perpendicular component of a magnetic flux density on a target surface was zero was 10 mT or more in the corner portions.

Example 8

A magnetic-field-generating apparatus was produced in the same manner as in Example 1, except for changing only magnets in the corner portions in the magnetic-field-generating apparatus 1 of Example 1 to anisotropic ferrite magnets available from Hitachi Metals, Ltd., with magnets in the linear portion unchanged. The thickness of each ferrite magnet in a direction perpendicular to its magnetization direction was set such that a horizontal component of a surface magnetic flux density was 10 mT or more at points at which a perpendicular component of the surface magnetic flux density was zero. The height j of the center magnetic pole member 32 and the peripheral magnetic pole member 33 was equal to the thickness of the ferrite magnets. In this magnetic-field-generating apparatus, points P and Q at which a perpendicular component of a magnetic flux density on a target surface was zero were substantially the same as those in Example 1.

Effects of the Invention

The use of the first magnetic-field-generating apparatus of the present invention permits points in corner portions, at which a perpendicular component of a magnetic flux density is zero, to expand outward, so that uniform erosion can be achieved in a linear portion and corner portions, resulting in a higher efficiency of utilizing a target.

Because of reduced amounts of magnets needed in the corner portions, the weight and production cost of the overall magnetic circuit can be reduced.

Because the corner portions and the linear portion can be separated, the design of the magnetic-field-generating apparatus can be easily modified depending on the material and size of a target.

Because a uniform magnetic field can be generated without arranging magnets in the entire corner portions, members necessary for sputtering can be arranged in vacant space in the corner portions.

Because the linear portion comprises many regions free from magnets, the magnetic-field-generating apparatus can be easily fixed to a sputtering apparatus by screws inserted into holes in the magnetic base from the target side (on the side of magnets arranged).

The second and third magnetic-field-generating apparatuses of the present invention can generate a magnetic field suitable for a target material, because their magnetic field can be adjusted by magnetic shunts. Also, because magnetic field intensities can be adjusted independently in arbitrary portions in the racetrack-shaped magnetic-field-generating apparatus, more uniform erosion proceeds in the target, forming a uniform-thickness thin film on a substrate. Particularly, a racetrack-shaped magnetic-field-generating apparatus tends to erode a target more in the corner portions than in the linear portion, but the erosion of the target can be made more uniform by changing the size, arrangement, etc. of magnetic shunts between the corner portions and the linear portion.

According to the present invention, a magnetic-field-generating apparatus designed to generate a slightly stronger magnetic field than required is provided with adjusting plates (magnetic shunts) on an entire or partial surface of a magnetic circuit on the opposite side of a target depending on the type of a thin film to be formed or the type of the target, so that the intensity of a magnetic field generated on the side of the target can easily be adjusted over the entire or partial surface. As a result, a magnetic field suitable for the quality of a film can be generated. Thus, a magnetic-field-generating apparatus with one magnetic circuit suitable for production capacity can form any thin film.

Because the magnetic shunts are detachable by simple operation, a magnetic field can be adjusted depending on the degree of erosion of a target even during sputtering. The differing erosion speed of a target depending on materials and sputtering conditions requires the adjustment of the intensity of a magnetic field, and such requirement can be met by the magnetic-field-generating apparatus of the present invention.

What is claimed is:

1. A racetrack-shaped magnetic-field-generating apparatus for magnetron sputtering, which comprises a linear portion and corner portions to generate a magnetic field on a target surface, said linear portion comprising a magnetic base, a center rectangular permanent magnet disposed on a surface of said magnetic base, and two side rectangular permanent magnets disposed on a surface of said magnetic base in parallel to and on both sides of said center permanent magnet with a gap;

said center permanent magnet and said side permanent magnets being arranged with their magnetization directions perpendicular to said target surface and their polarities opposite;

each of said corner portions comprising a non-magnetic base, a center magnetic pole member disposed on a surface of said non-magnetic base, a peripheral magnetic pole member disposed in a semicircular or semi-polygonal form with said center magnetic pole member as a center, and plural permanent magnets arranged between said center magnetic pole member and said peripheral magnetic pole member;

said plural permanent magnets being arranged with their magnetization directions in parallel to a surface of said target and the same polarity opposing said center magnetic pole member; and the magnetic poles of said plural permanent magnets opposing said center magnetic pole member having the same polarity as that of the magnetic pole of said center permanent magnet facing said target.

2. The magnetic-field-generating apparatus for magnetron sputtering according to claim 1, wherein said permanent magnets constituting said corner portions are fan-shaped or trapezoidal permanent magnets.

3. The magnetic-field-generating apparatus for magnetron sputtering according to claim 1, wherein said permanent magnets constituting said corner portions occupy 30% or more of an area between said center magnetic pole member and said peripheral magnetic pole member.

4. The magnetic-field-generating apparatus for magnetron sputtering according to claim 3, wherein a space between said center magnetic pole member and said peripheral magnetic pole member is filled with said permanent magnets, and non-magnetic spacers occupying other portions than said permanent magnets.

5. The magnetic-field-generating apparatus for magnetron sputtering according to claim 1, wherein said linear portion is filled with a non-magnetic spacer between said center permanent magnet and said side permanent magnets.

6. The magnetic-field-generating apparatus for magnetron sputtering according to claim 1, wherein positions at which a perpendicular component of a magnetic flux density of a magnetic field on said target surface is zero meet the requirement of $R \leq r$, wherein r is a horizontal distance from said center magnetic pole member in said corner portions, and R is a horizontal distance from said center permanent magnet in said linear portion.

7. The magnetic-field-generating apparatus for magnetron sputtering according to claim 1, wherein a horizontal component of a magnetic flux density at positions, at which a perpendicular component of said magnetic flux density on said target surface is zero, is 10 mT or more in said corner portions.

8. The magnetic-field-generating apparatus for magnetron sputtering according to claim 1, wherein said center permanent magnet and said side permanent magnets constituting said linear portion are rare earth magnets, and said plural permanent magnets constituting said corner portions are ferrite magnets.

9. The magnetic-field-generating apparatus for magnetron sputtering according to claim 1, wherein said linear portion is wider than each of said corner portions in a boundary in which said linear portion is opposing each of said corner portions.

10. The magnetic-field-generating apparatus for magnetron sputtering according to claim 1, wherein magnetic shunts for adjusting a magnetic field are arranged in said corner portions on the side of said base with respect to said permanent magnets.

* * * * *